(12) United States Patent
Chen et al.

(10) Patent No.: US 7,336,489 B1
(45) Date of Patent: Feb. 26, 2008

(54) WATERPROOF THERMAL MANAGEMENT MODULE AND PORTABLE

(75) Inventors: Yung-Hui Chen, Taipei (TW); Po-An Lin, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 11/674,676

(22) Filed: Feb. 14, 2007

(30) Foreign Application Priority Data

Aug. 1, 2006 (TW) .............................. 95128082 A

(51) Int. Cl.
*H05K 7/20* (2006.01)
(52) U.S. Cl. ...................... 361/700; 361/695; 361/699; 165/11.2; 165/80.4; 165/104.33; 165/104.34; 165/119; 165/121; 165/122; 174/15.2
(58) Field of Classification Search ................ 361/695, 361/699, 700; 257/E23.099, E23.088; 165/11.2, 165/104.33, 104.34, 80.4, 119, 121–122; 174/15.2
See application file for complete search history.

(56) References Cited

U.S. PATENT DOCUMENTS

| 5,930,115 | A | * | 7/1999 | Tracy et al. | ................. | 361/704 |
| 5,969,940 | A | * | 10/1999 | Sano et al. | .................. | 361/687 |
| 6,311,767 | B1 | * | 11/2001 | Inoue et al. | ................. | 165/80.4 |
| 6,442,025 | B2 | * | 8/2002 | Nakamura et al. | ........... | 361/695 |
| 6,567,269 | B2 | * | 5/2003 | Homer et al. | ................ | 361/700 |
| 6,650,540 | B2 | * | 11/2003 | Ishikawa | ..................... | 361/695 |
| 6,804,115 | B2 | * | 10/2004 | Lai | ............................. | 361/695 |
| 2004/0001316 | A1 | * | 1/2004 | Kamikawa et al. | .......... | 361/700 |
| 2004/0105233 | A1 | * | 6/2004 | Lai | ............................ | 361/695 |
| 2005/0168951 | A1 | * | 8/2005 | Hirafuji et al. | .............. | 361/700 |
| 2006/0181851 | A1 | * | 8/2006 | Frank et al. | ................. | 361/700 |
| 2007/0097643 | A1 | * | 5/2007 | Cheng | ......................... | 361/700 |
| 2007/0131383 | A1 | * | 6/2007 | Hattori et al. | .............. | 165/11.2 |

* cited by examiner

*Primary Examiner*—Boris Chervinsky
*Assistant Examiner*—Courtney L Smith
(74) *Attorney, Agent, or Firm*—Jianq Chyun IP Office

(57) ABSTRACT

A waterproof thermal management module for a portable electronic device that including a housing and a heat source is disclosed. The waterproof thermal management module includes a separated chamber, a heat absorber, a radiator, a heat pipe and a fan. The separated chamber is set inside the housing and has a first air channel and a second air channel, wherein the first and second air channels communicate with the outside of the housing. The heat absorber is set inside the housing for contacting the heat source. The radiator is set inside the separated chamber. The heat pipe extends from inside the housing through the wall of the separated chamber into the separated chamber and connects the heat absorber and the radiator. The cooling fan is set in the separated chamber.

12 Claims, 30 Drawing Sheets

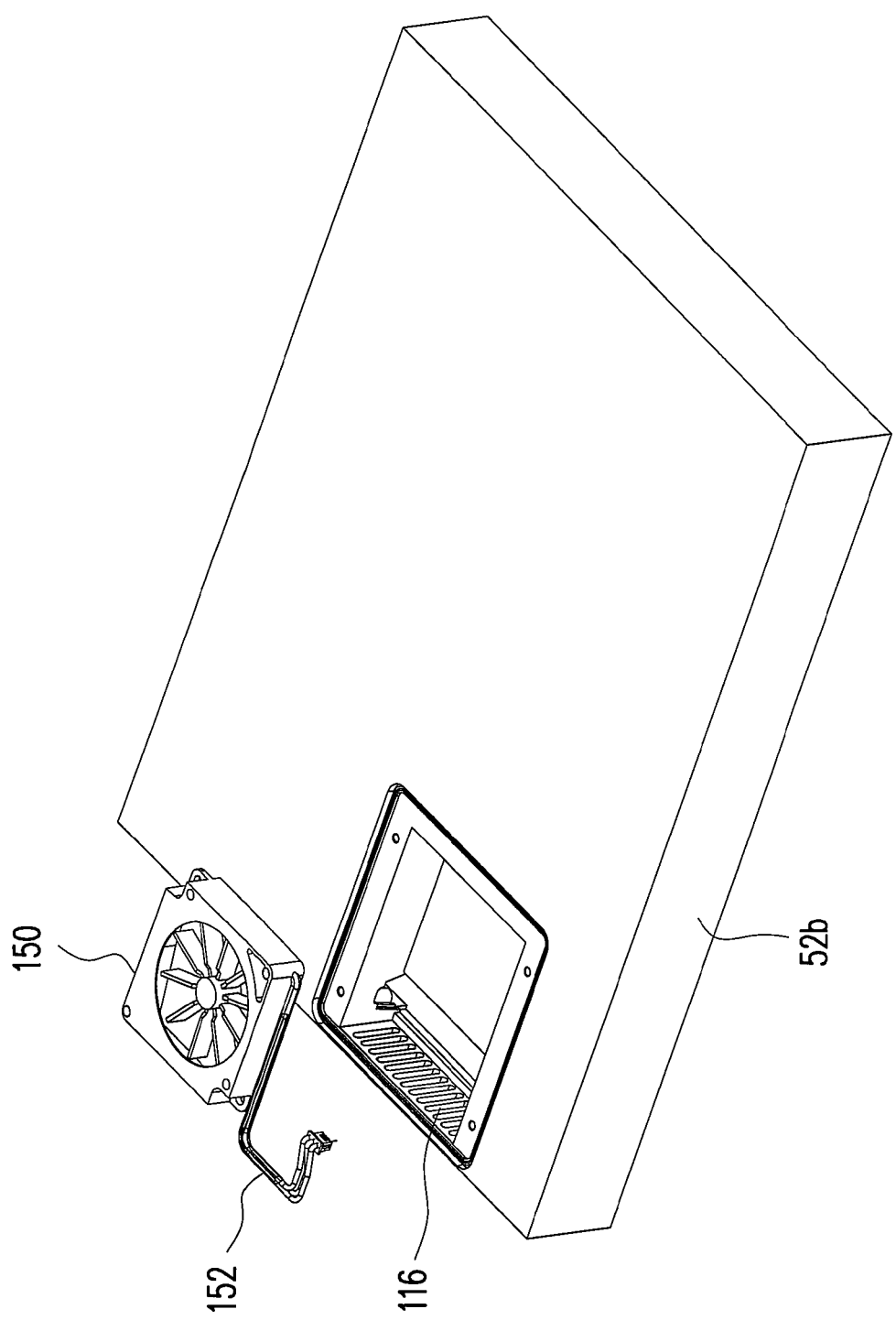

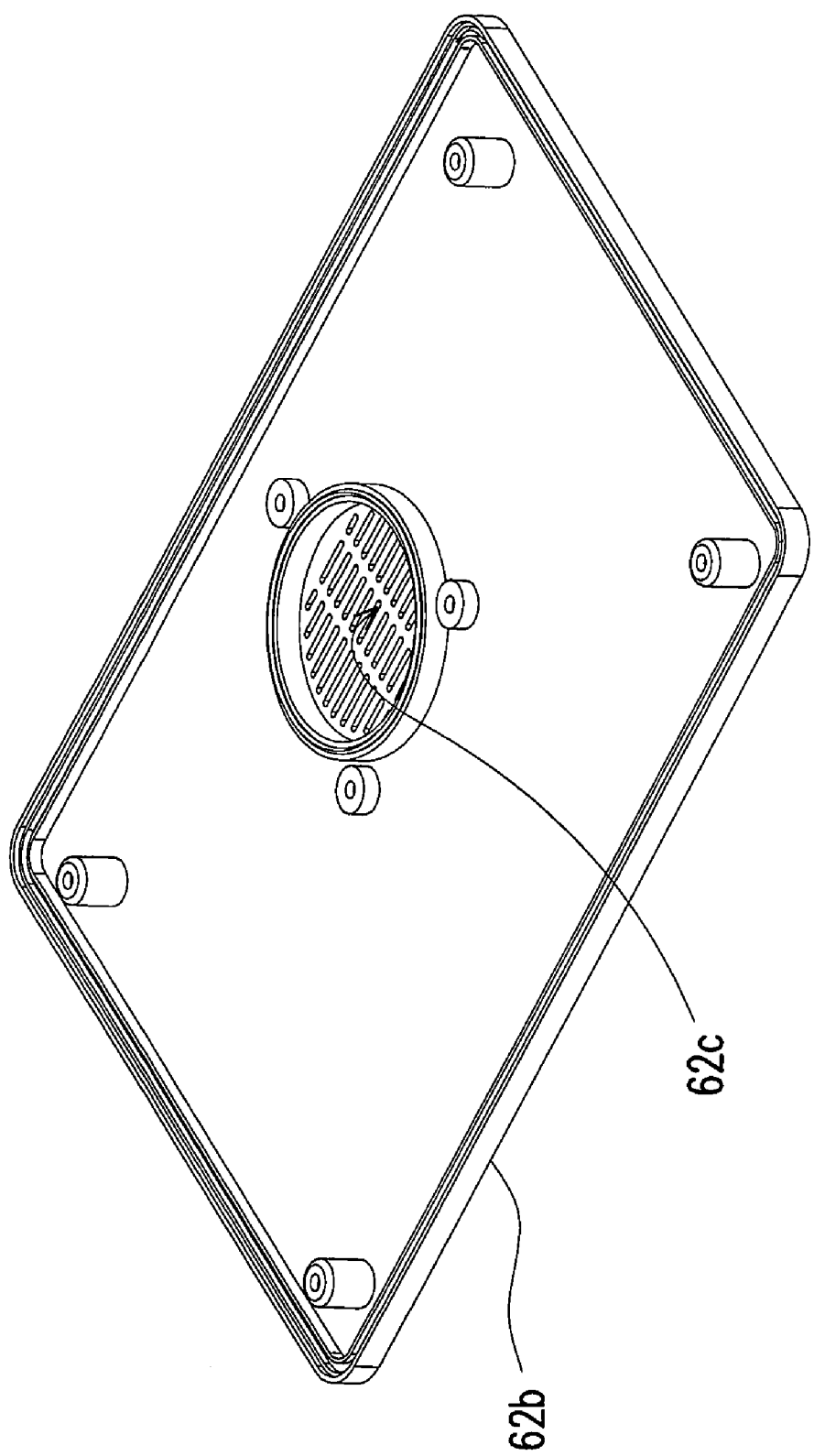

WATERPROOF THERMAL MANAGEMENT MODULE AND PORTABLE

CROSS-REFERENCE TO RELATED APPLICATION

This application claims the priority benefit of Taiwan application serial no. 95128082, filed Aug. 1, 2006. All disclosure of the Taiwan application is incorporated herein by reference.

ELECTRONIC APPARATUS USING THE SAME

1. Field of the Invention

The present invention relates to a waterproof thermal management module, and more particularly, the present invention relates to a portable electronic apparatus using the same.

2. Description of Related Art

In recent years, the general trend of portable electronic apparatus is miniaturization and multi-functional, chips with more powerful in function and higher speed. As the speed of chips is increased, correspondingly more heat is generated, and due to the miniaturization of the device, the thermal management module becomes an indispensable device of a portable electronic apparatus.

A portable electronic device may be sometimes subjected to unfavorable environment, for example, a notebook computer may be dropped to the ground during carriage by a user or liquids may be accidentally spilled on the notebook computer. Moreover, a notebook computer may be used in an awful environment, even in a war. Thus, waterproof and shockproof functions are required for such portable electronic devices to endure them to work properly in various circumstances.

With the factors described above, waterproof function of a portable electronic device in daily use becomes essential. Thus, the thermal management module having a waterproof function becomes one of the keystones of a portable electronic device.

SUMMARY OF THE INVENTION

The present invention is directed to a waterproof thermal management module used for a portable electronic device to simplify the assembly process and reduce thickness of the device.

The present invention is directed to a portable electronic device employing waterproof thermal management module to simplify the assembly process and reduce thickness of the device.

The present invention provides a waterproof thermal management module used for a portable electronic device, which includes a housing and a heat source inside the housing. The waterproof thermal management module includes a separated chamber, a heat absorber, a radiator, a heat pipe and a fan. The separated chamber is set inside the housing and has a first air channel and a second air channel communicating with the outside of the housing. The separated chamber includes a first separated cover, a second separated cover and a side cover, wherein the first separated cover is integrally formed with the housing, and the second separated cover is assembled to the first separated cover to form the first air channel. The side cover is integrally formed with the housing and forms the second air channel. The first separated cover includes an assembly opening and a sealing cover for sealing the assembly opening. Waterproof adhesive is disposed at the joint between the assembly opening and the sealing cover. The heat absorber is set inside the housing for contacting the heat source. The radiator is set inside the separated chamber. The heat pipe extends from inside the housing through the wall of the separated chamber into the separated chamber, and connects the heat absorber and the radiator. Waterproof adhesive is disposed between a segment of the heat pipe and the wall of the separated chamber where the heat pipe passes through, wherein the heat pipe extends through the space between the assembly opening and the sealing cover. The cooling fan is set inside the separated chamber.

According to an embodiment of the present invention, the waterproof thermal management module aforementioned further comprises a power core extending from inside the housing through the wall to the separated chamber and connecting the cooling fan. Waterproof adhesive is disposed between a segment of the power core and the wall of the separated chamber where the power core passes through, wherein the power core extends through the space between the assembly opening and the sealing cover.

The present invention provides a waterproof thermal management module used for a portable electronic device, which includes a housing and a heat source inside the housing. The housing includes a top cover and a base cover assembled to the top cover. The waterproof thermal management module includes a separated chamber, a heat absorber, a radiator, a heat pipe and a fan. The separated chamber is set inside the housing and has a first air channel and a second air channel communicating with the outside of the housing. The separated chamber includes a first separated cover, a second separated cover and a side cover, wherein the first separated cover is assembled to the inner side of the top cover, and the second separated cover is assembled to the first separated cover to form the first air channel. The base cover has a connective opening connected to the first air channel. The side cover is integrally formed with the top cover and forms the second air channel. Each of the first separated cover and the second separated cover is connected to the side cover. Waterproof adhesive is disposed at the joint between the first separated cover and the second separated cover, at the joint between the first separated cover and the side cover, and at the joint between the second separated cover and the side cover. Waterproof adhesive is also disposed at the joint between a portion of the second separated cover surrounding the first air channel and a portion of the base cover surrounding the connective opening. The heat absorber is set inside the housing for contacting the heat source. The radiator is set inside the separated chamber. The heat pipe extends from inside the housing through the wall to the separated chamber and connects the heat absorber and the radiator. Waterproof adhesive is disposed between a segment of the heat pipe and the wall of the separated chamber where the heat pipe passes through, wherein the heat pipe extends through the space between the first separated cover and the second separated cover. The cooling fan is set inside the separated chamber.

According to an embodiment of the present invention, the waterproof thermal management module aforementioned further comprises a power core extending from inside the housing through the wall to the separated chamber and connecting the cooling fan. Waterproof adhesive is disposed between the power core and the wall of the separated chamber where the power core passes through, wherein the power core extends through the space between the first separated cover and the second separated cover.

The present invention provides a waterproof thermal management module used for a portable electronic device, which includes a housing and a heat source inside the housing. The housing includes a top cover and a base cover assembled to the top cover. The waterproof thermal management module includes a separated chamber, a heat absorber, a radiator, a heat pipe and a fan. The separated chamber is set inside the housing and has a first air channel and a second air channel communicating with the outside of the housing, and the separated chamber also includes a first separated cover, a second separated cover and a side cover. The first separated cover is assembled to the inner side of the top cover, and the second separated cover is integrally formed with the base cover and forms the first air channel. The side cover is integrally formed with the top cover and forms the second air channel. The first separated cover is connected to the second separated cover, the second separated cover is connected to the side cover, and the second separated cover has a connective opening connected to the second air channel. Waterproof adhesive is disposed at the joint between the first separated cover and the second separated cover. Waterproof adhesive is also disposed at the joint between the second separated cover and the side cover. The heat absorber is set inside the housing for contacting the heat source. The radiator is set inside the separated chamber. The heat pipe extends from inside the housing through the wall to the separated chamber and connects the heat absorber and the radiator. Waterproof adhesive is disposed between a segment of the heat pipe and the wall of the separated chamber where the heat pipe passes through, wherein the heat pipe extends through the space between the first separated cover and the second separated cover. The cooling fan is set inside the separated chamber.

According to an embodiment of the present invention, the waterproof thermal management module aforementioned further comprises a power core extending from inside the housing through the wall to the separated chamber and connecting the cooling fan, waterproof adhesive is disposed between a segment of the power core and the wall of the separated chamber where the power core passes through, wherein the power core extends through the space between the first separated cover and the second separated cover.

The present invention provides a portable electronic device including a housing, a heat source inside the housing and a waterproof thermal management module. The waterproof thermal management module includes a separated chamber, a heat absorber, a radiator, a heat pipe, and a fan. The separated chamber is set inside the housing and has a first air channel and a second air channel communicating with the outside of the housing. The separated chamber also includes a first separated cover, a second separated cover and a side cover. The first separated cover is integrally formed with the housing, and the second separated cover is assembled to the first separated cover to form the first air channel. The side cover is integrally formed with the housing and forms the second air channel, and the first separated cover includes an assembly opening and a sealing cover for sealing the assembly opening. Waterproof adhesive is disposed at the joint between the assembly opening and the sealing cover. The heat absorber is set inside the housing for contacting the heat source. The radiator is set inside the separated chamber. The heat pipe extends from inside the housing through the wall to the separated chamber and connects the heat absorber and the radiator. Waterproof adhesive is disposed between a segment of the heat pipe and the wall of the separated chamber where the heat pipe passes through, wherein the heat pipe extends through the space between the assembly opening and the sealing cover. The cooling fan is set inside the separated chamber.

According to an embodiment of the present invention, the portable electronic device aforementioned further comprising a power core extending from inside the housing through the wall to the separated chamber and connecting the cooling fan. Waterproof adhesive is disposed between a segment of the power core and the wall of the separated chamber where the power core passes through, wherein the power core extends through the space between the assembly opening and the sealing cover.

The present invention provides a portable electronic device including a housing, a heat source inside the housing and a waterproof thermal management module. The housing includes a top cover and a base cover assembled to the top cover. The base cover has a connective opening. The waterproof thermal management module includes a separated chamber which is set inside the housing and has a first air channel and a second air channel communicating with to the outside of the housing. The separated chamber also includes a first separated cover, a second separated cover and a side cover. The first separated cover is assembled to the inner side of the top cover, and the second separated cover is assembled to the first separated cover to form the first air channel. The base cover has a connective opening which is connected to the first air channel. The side cover is integrally formed with the top cover and forms the second air channel, each of the first separated cover and the second separated cover is connected to the side cover. Waterproof adhesive is disposed at the joint between the first separated cover and the second separated cover, and at the joint between the first separated cover and the side cover, and at the joint between the second separated cover and the side cover. Waterproof adhesive is also disposed at the joint between a portion of the second separated cover surrounding the first air channel and a portion of the base cover surrounding the connective opening. The heat absorber is set inside the housing for contacting the heat source. The radiator is set inside the separated chamber. The heat pipe extends from inside the housing through the wall to the separated chamber and connects the heat absorber and the radiator. Waterproof adhesive is disposed between the heat pipe and the wall of the separated chamber where the heat pipe passes through, wherein the heat pipe extends through the space between the first separated cover and the second separated cover. The cooling fan is set inside the separated chamber.

According to an embodiment of the present invention, the portable electronic device aforementioned further comprising a power core extending from inside the housing through the wall to the separated chamber and connects the cooling fan. Waterproof adhesive is disposed between a segment of the power core and the wall of the separated chamber where the power core passes through, wherein the power core extends through the space between the first separated cover and the second separated cover.

The present invention provides a portable electronic device includes a housing, a heat source inside the housing and a waterproof thermal management module. The housing includes a top cover and a base cover assembled to the top cover. The waterproof thermal management module includes a separated chamber, a heat absorber, a radiator, a heat pipe and a fan. The separated chamber is set inside the housing and has a first air channel and a second air channel communicating with the outside of the housing, and the separated chamber also includes a first separated cover, a second separated cover and a side cover. The first separated cover is assembled to the inner side of the top cover, and the second separated cover is integrally formed with the base cover and forms the first air channel. The side cover is integrally formed with the top cover and forms the second air channel. The first separated cover is connected to the second separated cover. The second separated cover is connected to the side cover. The second separated cover has a connective opening connected to the second air channel. Waterproof adhesive is disposed at the joint between the first separated cover and the second separated cover. Waterproof adhesive is also disposed at the joint between the second separated cover and the side cover. The heat absorber is set inside the housing for contacting the heat source. The radiator is set inside the separated chamber. The heat pipe extends from inside the housing through the wall to the separated chamber and connects the heat absorber and the radiator. Waterproof adhesive is disposed between the heat pipe and the wall of the separated chamber where the heat pipe passes through, wherein the heat pipe extends through the space between the first separated cover and the second separated cover. The cooling fan is set inside the separated chamber.

According to an embodiment of the present invention, the portable electronic device aforementioned further comprising a power core, that extends from inside the housing through the wall to the separated chamber and connects the cooling fan. Waterproof adhesive is disposed between a segment of the power core and the wall of the separated chamber where the power core passes through, wherein the power core extends through the space between the first separated cover and the second separated cover.

The present invention uses the waterproof design to form an enclosed space in the housing of a portable electronic device having a remote heat exchange design, so as to prevent water and moisture from entering into the housing. Moreover, in the present invention, the separated chamber for containing the aforementioned radiator that is disposed on the outside of the enclosed space is designed by a modular approach, so that assembly of the portable electronic device may be substantially improved accordingly.

In order to make the aforementioned and other objects, features and advantages of the present invention comprehensible, a plurality of embodiments accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A, 5B, 5C illustrate an assembling process of some of the parts of the portable electronic device shown in FIG. 1.

FIG. 8C is a perspective view of the base cover of FIG. 6 with a certain angle of rotation.

DESCRIPTION OF THE EMBODIMENTS

Figure 1:
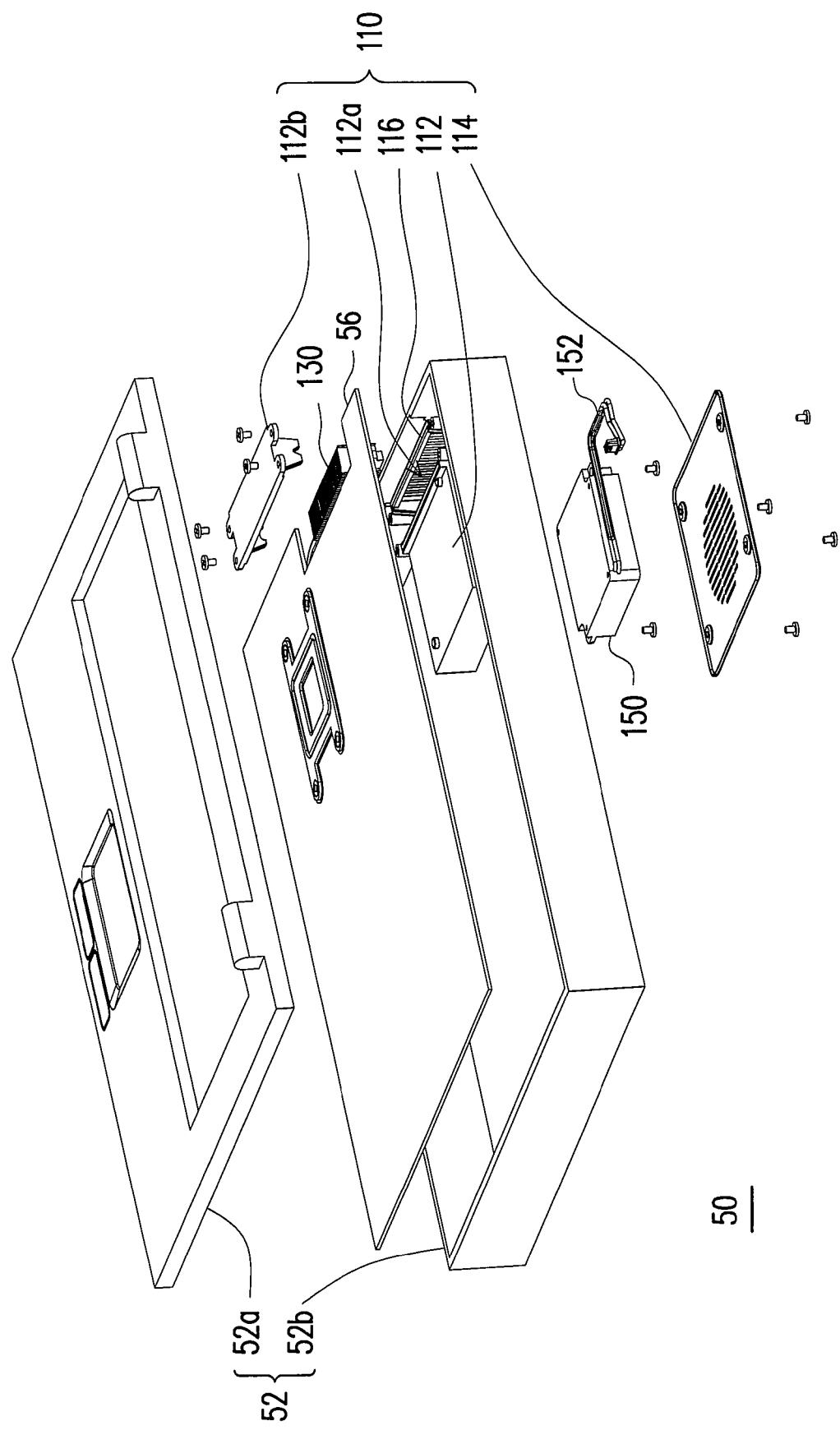
FIG. 1 is an exploded view of a portable electronic device according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The First Embodiment

Figure 2:
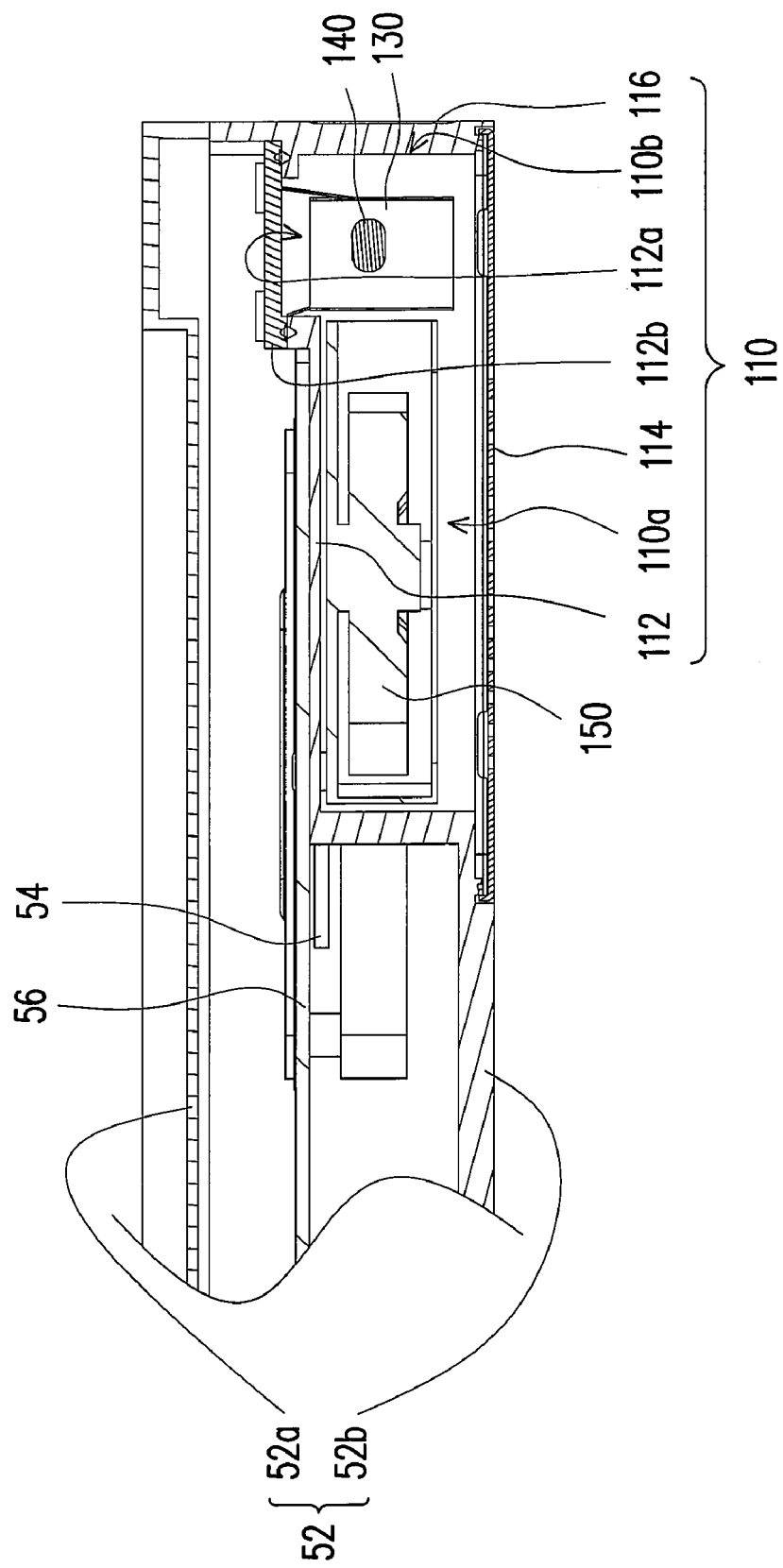
FIG. 2 is a sectional view of the portable electronic device of FIG. 1.

FIG. 1 is an exploded view of a portable electronic device according to a first embodiment of the present invention. FIG. 2 is a sectional view of the portable electronic device shown in FIG. 1. Referring FIGS. 1 and 2, the portable electronic device 50 of the first embodiment comprises a housing 52, a heat source 54 (FIG. 2), a mainboard 56 and a waterproof thermal management module. The housing 52 comprises a top cover 52a and a base cover 52b. The waterproof thermal management module comprises a separated chamber 110 (FIG. 2), a heat absorber 120 (FIG. 3), a radiator 130, a heat pipe 140 (FIG. 3), and a fan 150. The fan 150 comprises a power core 152.

Referring FIGS. 1 and 2, the separated chamber 110 has an enclosed space, configured to contain the radiator 130 and the fan 150, and isolate the radiator 130 and the fan 150 from other parts inside the housing 52. The separated chamber 110 comprises a first separated cover 112 integrally formed with the base cover 52b of the housing 52, a second separated cover 114 and a side cover 116. The first separated cover 112 further comprises an assembly opening 112a and a sealing cover 112b. The second separated cover 114 is assembled to the first separated cover 112 to form a first air channel 110a. The side cover 116 is integrally formed with the base cover 52b and forms a second air channel 110b. Each of the first air channel 110a and the second air channel 110b communicating with the outside of the housing 52. The fan 150 provides cooling air to cool down the radiator 130 through the first air channel 110a, and expels hot air through the second air channel 110b.

Figure 3:
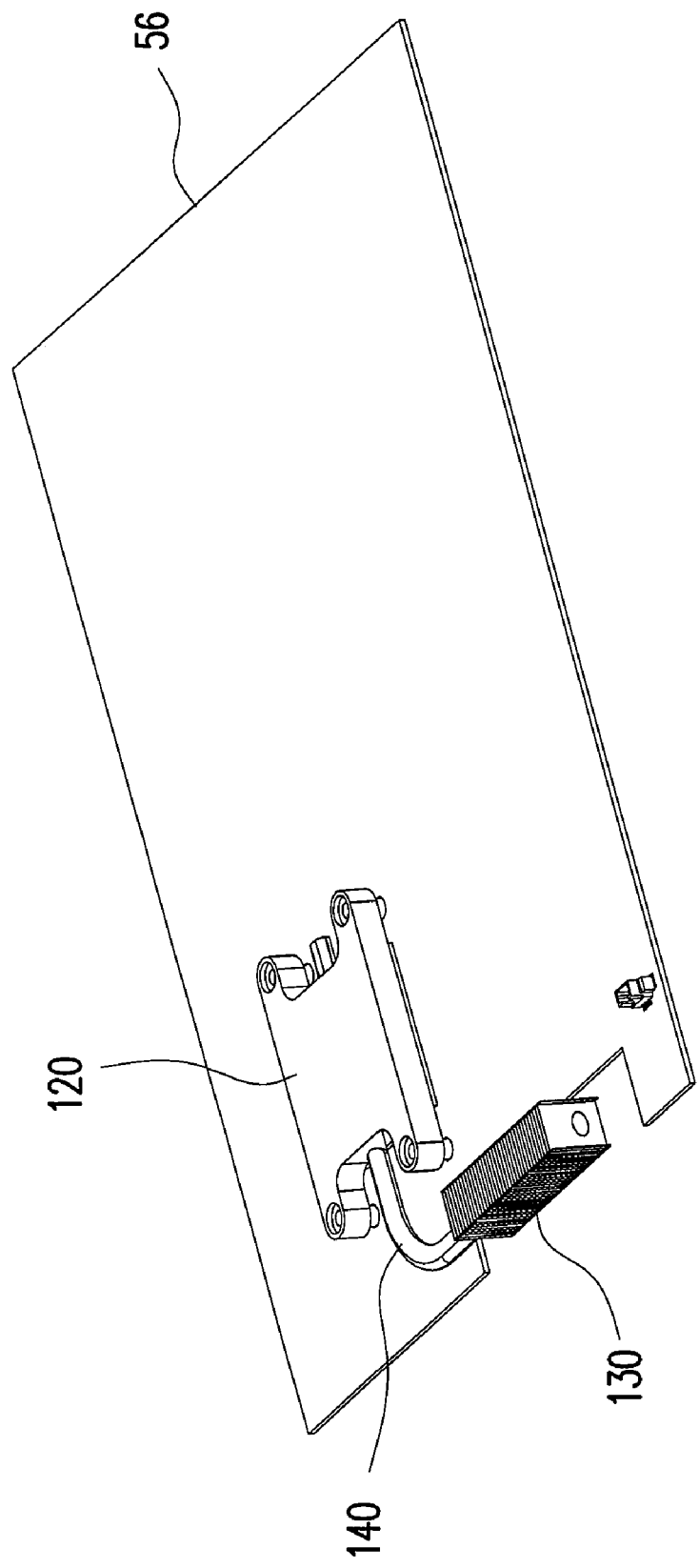
FIG. 3 is a perspective view of the mainboard carrying the heat absorber, the radiator and the heat pipe of FIG. 1.

FIG. 3 is a perspective view of the mainboard carrying the heat absorber, the radiator and the heat pipe of FIG. 1. Referring FIG. 3, the heat absorber 120, the radiator 130 and the heat pipe 140 are assembled to the mainboard 56 in a modular approach. The heat pipe 140 is connected to the heat absorber 120 and the radiator 130. The heat absorber 120 contacts the heat source 54 (FIG. 2), and transfers heat to the radiator 130 through the heat pipe 140.

Figure 4A:
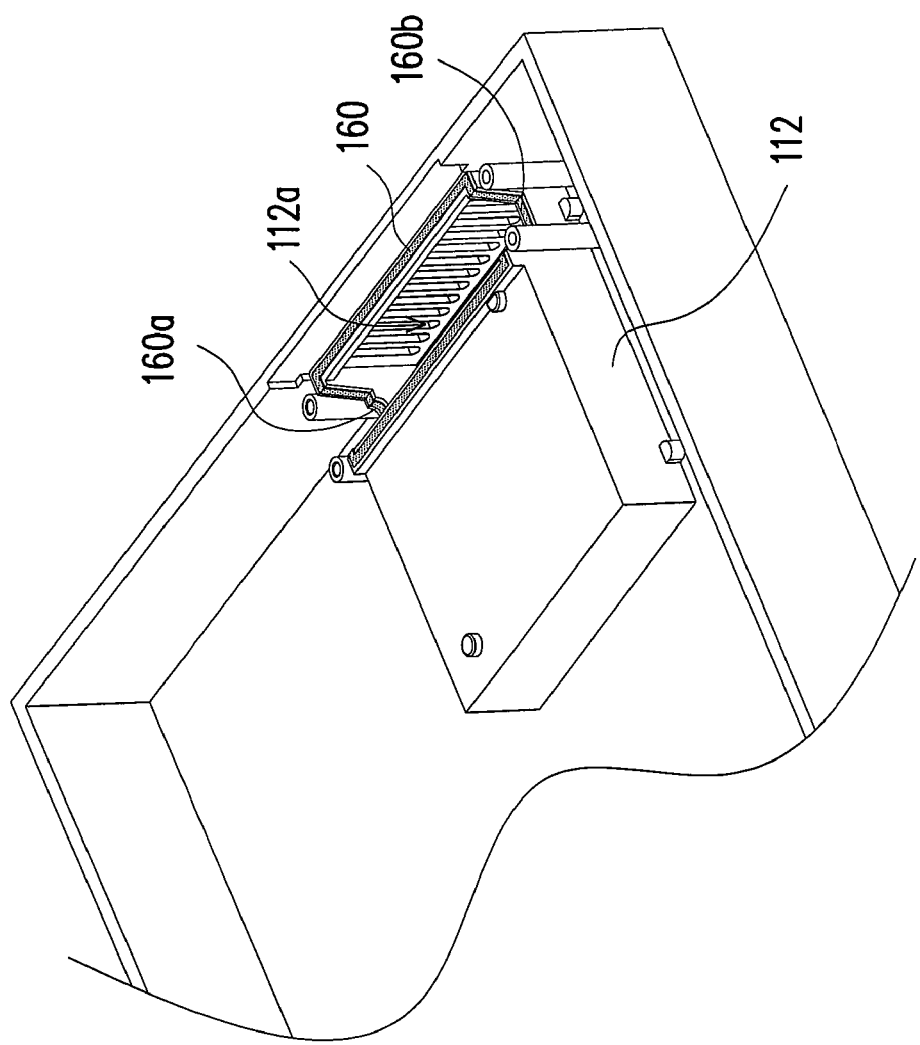
FIG. 4A illustrates a distribution of waterproof adhesive of the sealing cover of FIG. 1.
Figure 4B:
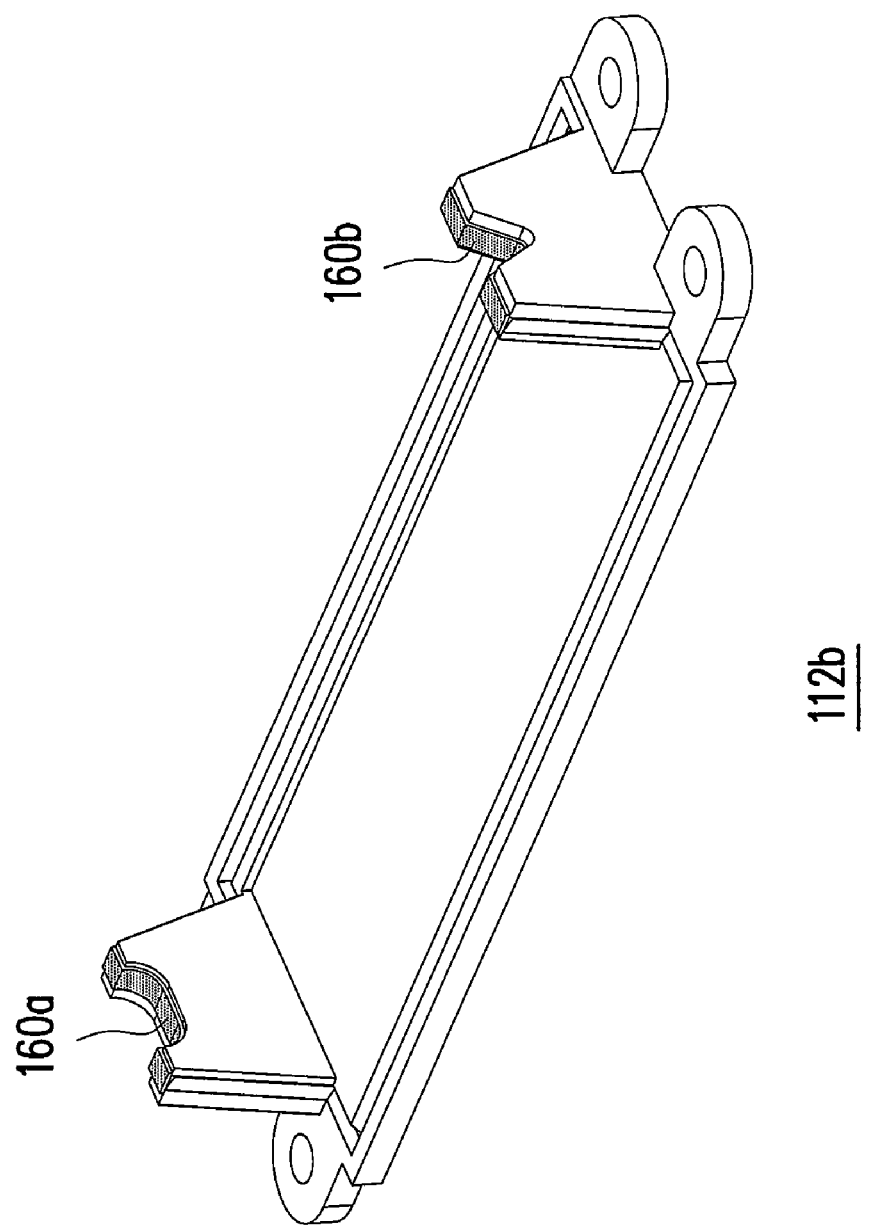
FIG. 4B illustrates a distribution of waterproof adhesive of the assembly opening of FIG. 1.

FIG. 4A illustrates a distribution of waterproof adhesive of the assembly opening of FIG. 1, and FIG. 4B illustrates a distribution of waterproof adhesive of the sealing cover of FIG. 1. Referring FIGS. 4A and 4B, waterproof adhesive 160,160a, and 160b are disposed at the joint between the assembly opening 112a and the sealing cover 112b. In this embodiment, waterproof adhesive 160 (FIG. 4A) and 160a (FIG. 4b) are disposed between a segment of the heat pipe 140 (FIG. 3) and the wall of the separated chamber 110 where the heat pipe passes through. The heat pipe 140 extends though the space between the assembly opening 112a and the sealing cover 112b. Moreover, waterproof adhesive 160 and 160b are disposed between a segment of the power core 152 (FIG. 1) and the wall of the separated chamber 110 (FIG. 2) where the power core 152 passes through. The power core 152 of FIG. 1 extends though the space between the assembly opening 112a and the sealing cover 112b. Thus, water and vapour are prevented from entering inside the enclosed space by disposing waterproof adhesive at the joint between the aforementioned elements.

Figure 5B:
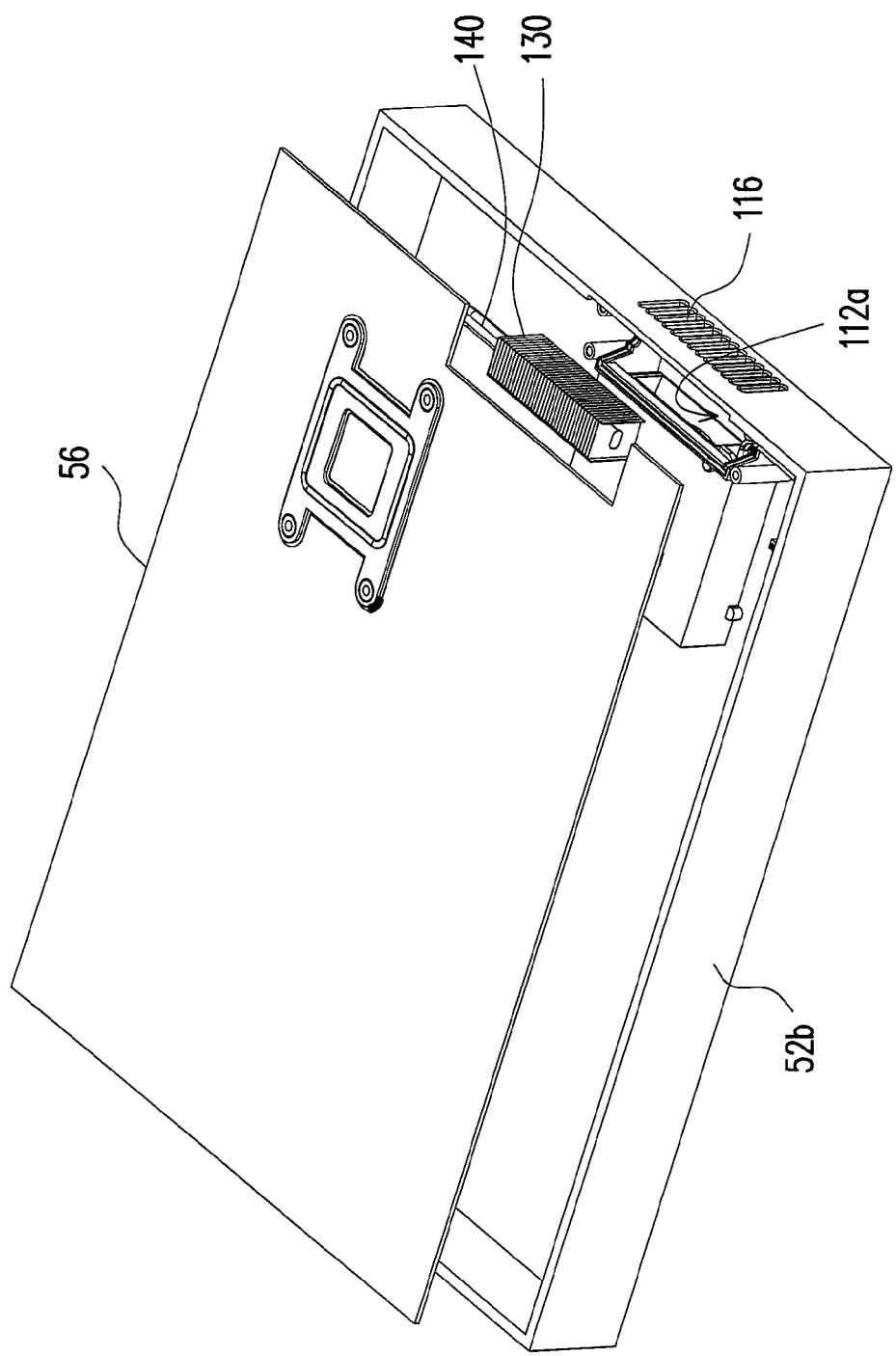
Figure 5C:
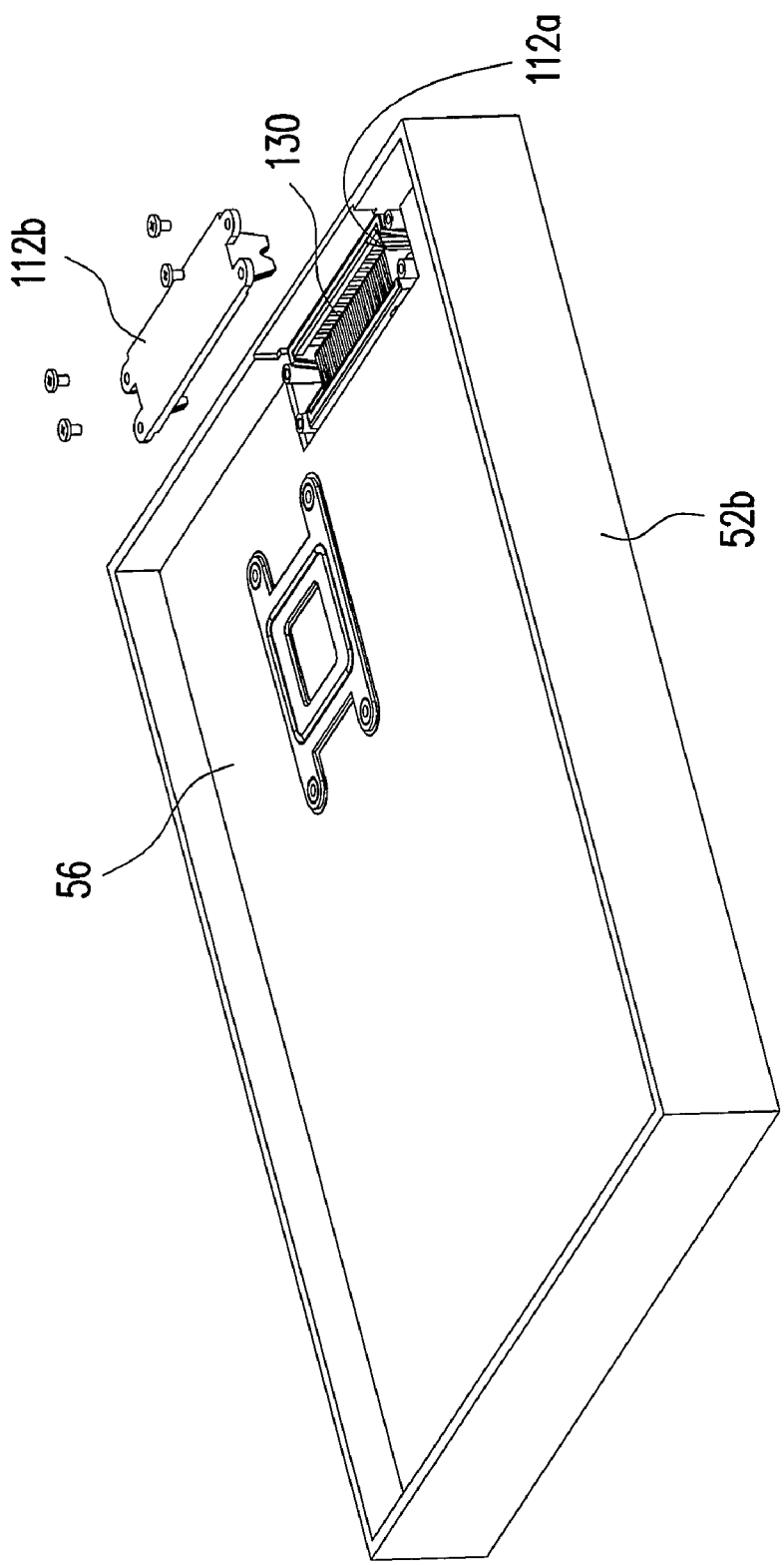

FIG. 5A, 5B, 5C illustrate an assembling process of some of the parts of a portable electronic device shown in FIG. 1. Referring FIGS. 1, 5A, 5B and 5C, components of the portable electronic device 50 may be assembled according to the following steps.

1. The fan 150 is fixed in the separated chamber 110 with screws as shown in FIG. 5A.

2. The second separated cover 114 is locked to the first separated cover 112 to form the first air channel 110a of FIG. 2 as shown in FIG. 5B.

3. The mainboard 56 is assembled to the base cover 52b of the housing 52, wherein the mainboard 56 comprises the heat absorber 120 (FIG. 3), the radiator 130 and the heat pipe 140, and the radiator 130 is passed through the assembly opening 112a as shown in FIG. 5B.

4. The sealing cover 112b is locked to the separated chamber 110 (FIG. 2) to seal the assembly opening 112a as shown in FIG. 5C.

The heat absorber mentioned in the first embodiment may be a cooling pad or a thermal pad, and the radiator may be a heat sink.

The Second Embodiment

Figure 6:
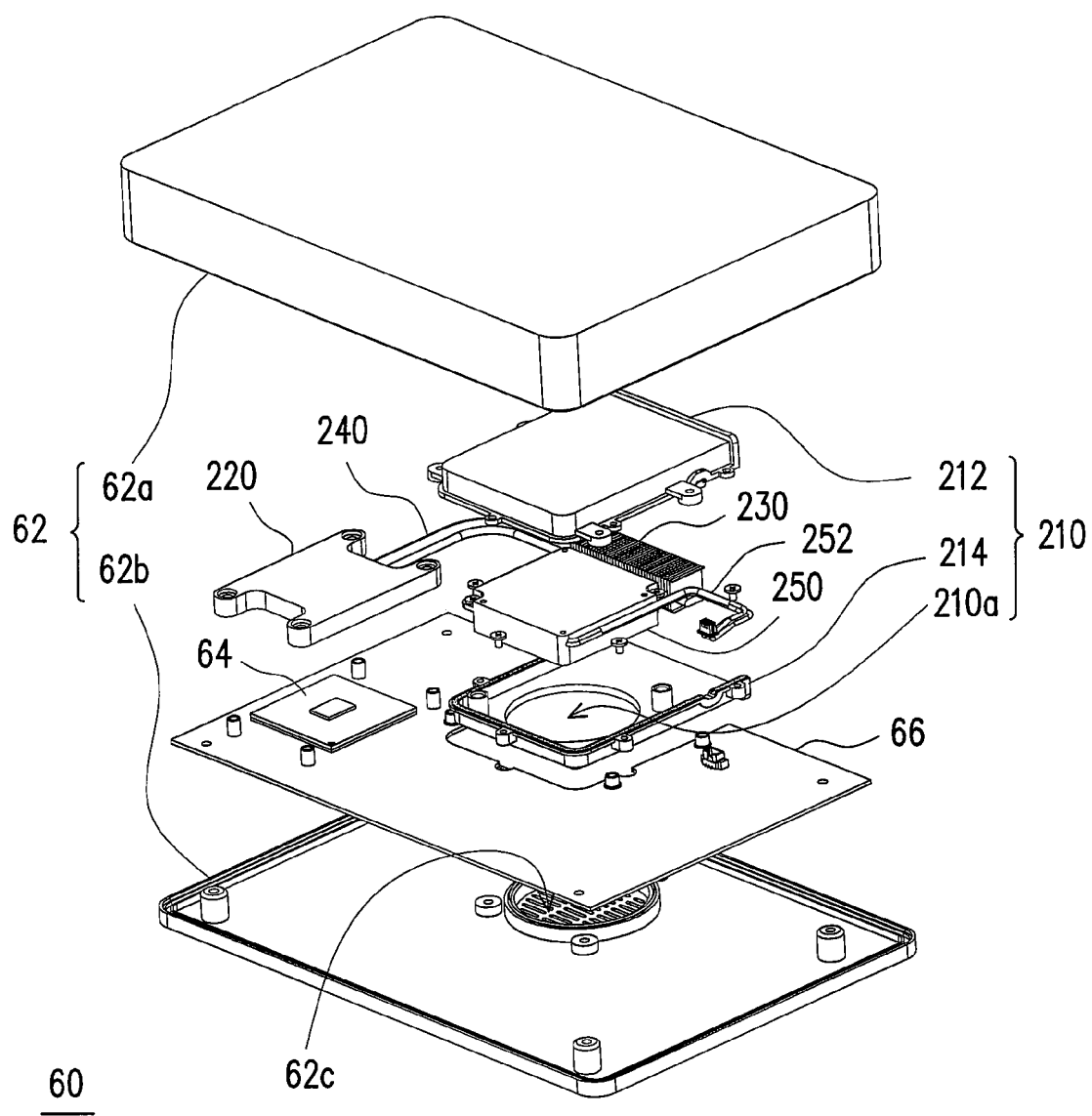
FIG. 6 is an exploded view of a portable electronic device according to a second embodiment of the present invention.
Figure 7:
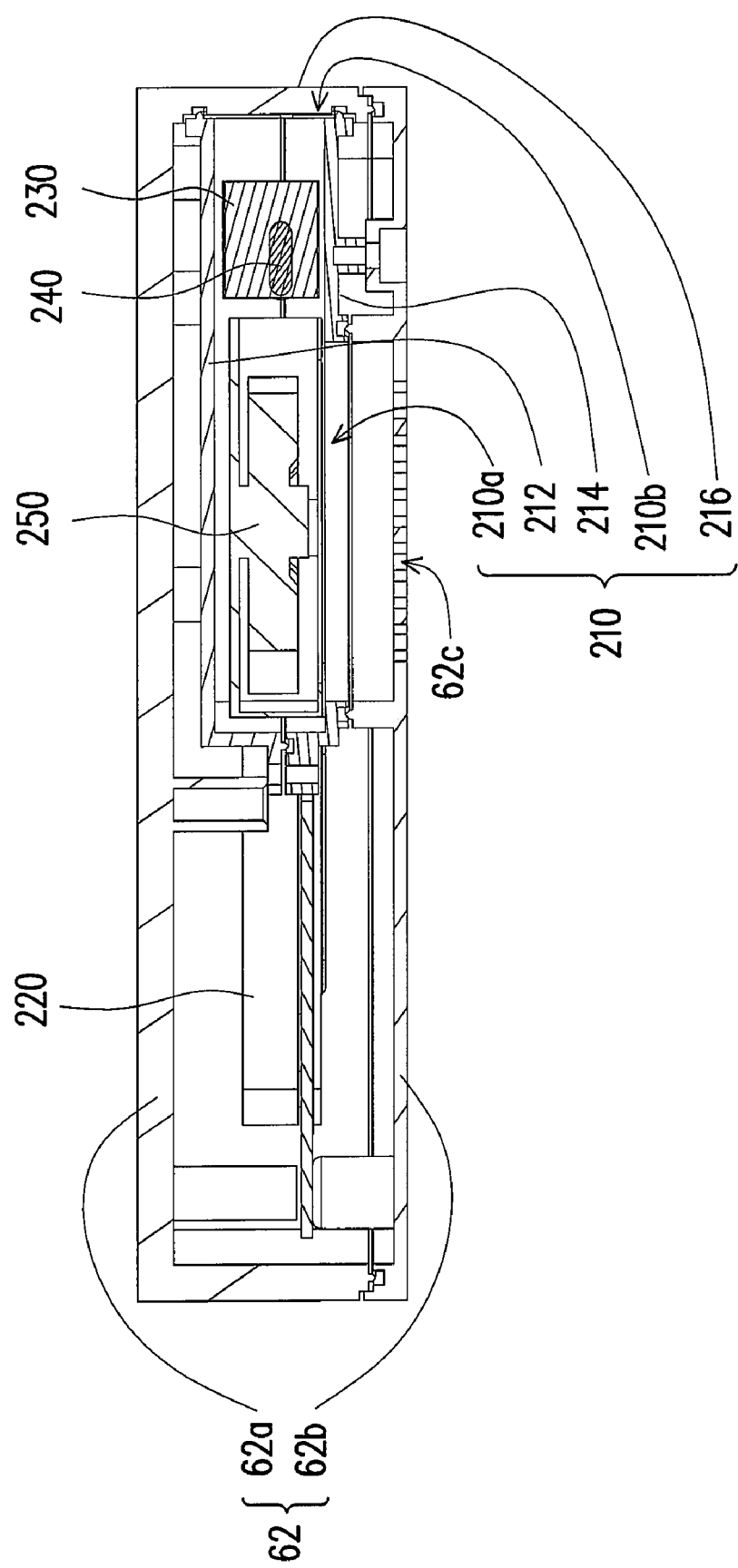
FIG. 7 is a sectional view of the portable electronic device of FIG. 6.

FIG. 6 is an exploded view of a portable electronic device according to a second embodiment of the present invention, and FIG. 7 is a sectional view of the portable electronic device of FIG. 6. Referring FIGS. 6 and 7, the portable electronic device 60 of the second embodiment comprises a housing 62, a heat source 64, a mainboard 66 and a waterproof thermal management module. The housing 62 comprises a top cover 62a and a base cover 62b, and the base cover 62b has a connective opening 62c. The waterproof thermal management module comprises a separated chamber 210 (FIG. 7), a heat absorber 220, a radiator 230, a heat pipe 240, and a fan 250. The fan 250 comprises a power core 252.

Referring FIG. 7, the separated chamber 210 has an enclosed space, configured to contain the radiator 230 and the fan 250, and isolate the radiator 230 and the fan 250 from other parts in the housing 62. The separated chamber 210 comprises a first separated cover 212, a second separated cover 214 and a side cover 216. The second separated cover 214 forms a first air channel 210a. The side cover 216 is integrally formed with the top cover 62a and forms a second air channel 20b. Each of the first air channel 210a and the second air channel 210b communicating with the outside of the housing 62. The fan 250 provides cooling air to cool down the radiator 230 through the first air channel 210a, and expels hot air through the second air channel 210b.

Figure 8A:
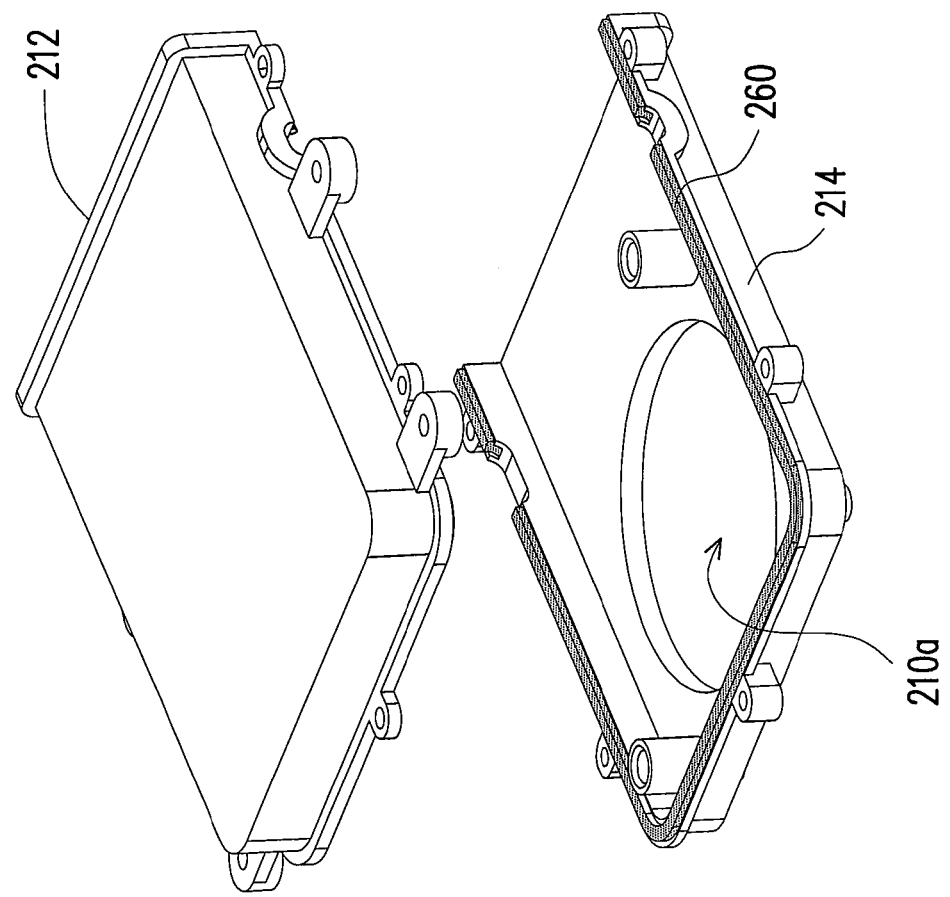
FIG. 8A illustrates a distribution of waterproof adhesive between the first separated cover and the second separated cover of FIG. 6.
Figure 8B:
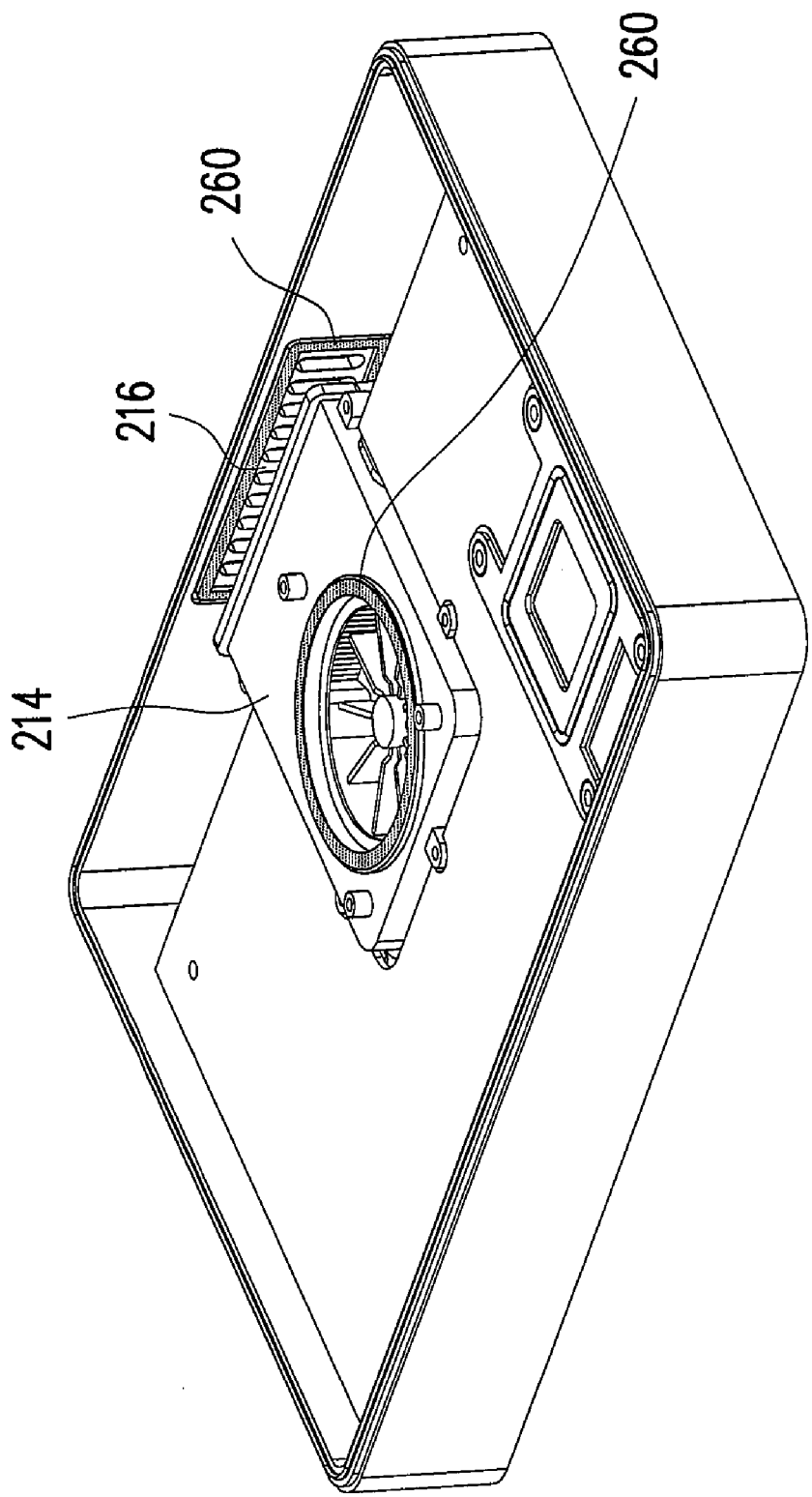
FIG. 8B illustrates a distribution of waterproof adhesive between the side cover and the first separated cover and between the side cover and the second separated cover of FIG. 6, and a distribution of waterproof adhesive where the base cover surrounding the connective opening.

FIG. 8A illustrates a distribution of waterproof adhesive between the first separated cover and the second separated cover of FIG. 6, and FIG. 8B illustrates a distribution of waterproof adhesive between the side cover and the first separated cover and between the side cover and the second separated cover, and a distribution of waterproof adhesive where the base cover surrounding the connective opening. FIG. 8C is a perspective view of the base cover of FIG. 6 with a certain angle of rotation. Referring FIGS. 8A, 8B and 8C, waterproof adhesive 260 is disposed at the joint between the first separated cover 212 and the second separated cover 214, at the joint between the first separated cover 212 and the side cover 216, and at the joint between the second separated cover 214 and the side cover 216. Moreover, the waterproof adhesive 260 is also disposed at the joint between a portion of the second separated cover 214 surrounding the first air channel 210a and a portion of the base cover 62b surrounding the connective opening 62c as shown in FIGS. 8A, 8B and 8C. Thus, water and moisture are prevented from entering inside the enclosed space by disposing waterproof adhesive at the joint between the aforementioned elements.

FIGS. 9A-9G illustrate an assembling process of some of the parts of the portable electronic device shown in FIG. 6. Referring FIGS. 9A-9G, components of the portable electronic device 60 (FIG. 6) may be assembled according to the following steps.

Figure 9A:
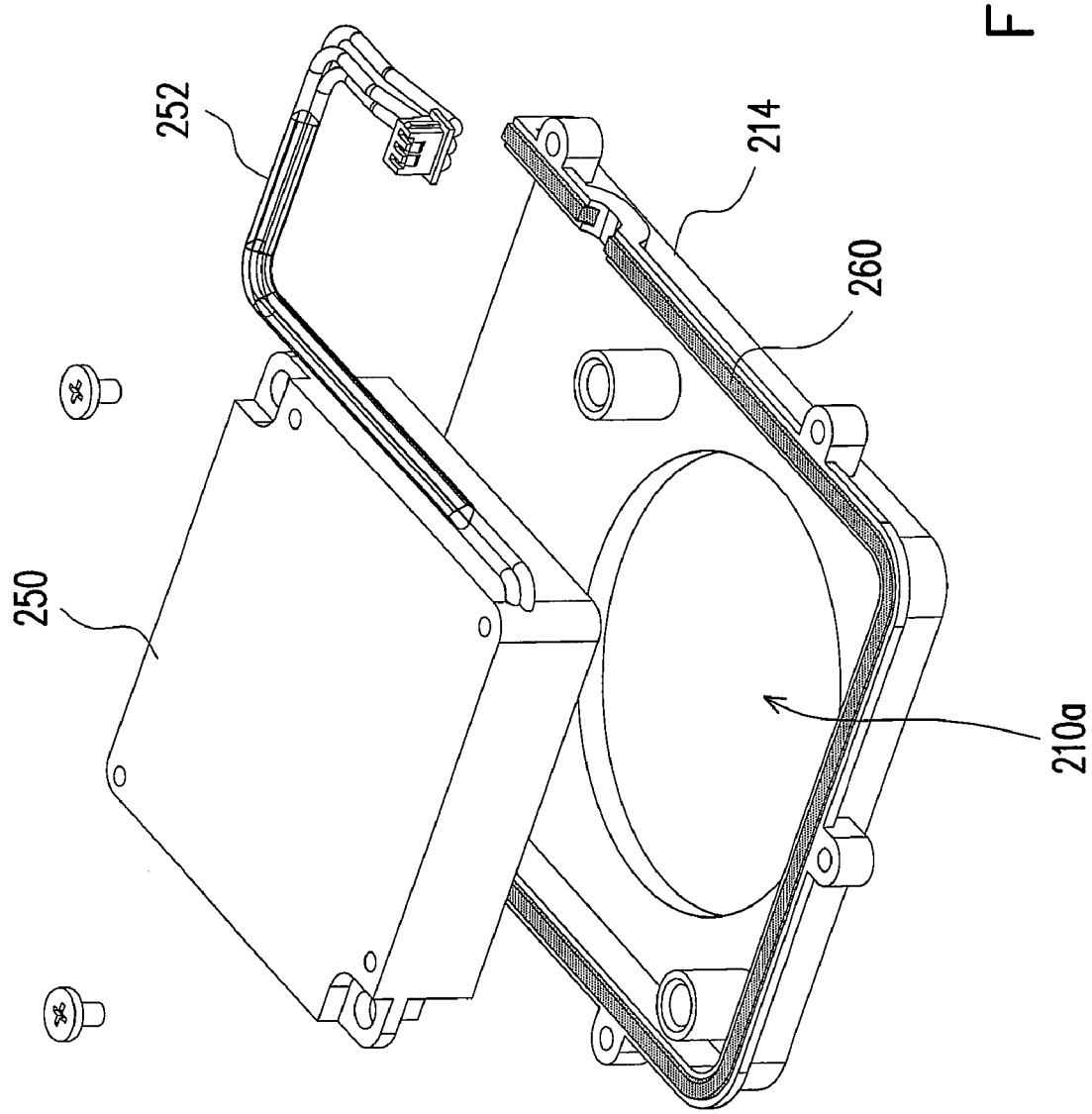
FIGS. 9A-9G illustrate an assembling process of some of the parts of the portable electronic device shown in FIG. 6.

1. The fan 250 is fixed in the second separated cover 214 with screws, and the power core 252 is extended through the wall of the separated chamber 210 to the separated chamber 210 to connect the fan 250 as shown in FIG. 9A.

Figure 9B:
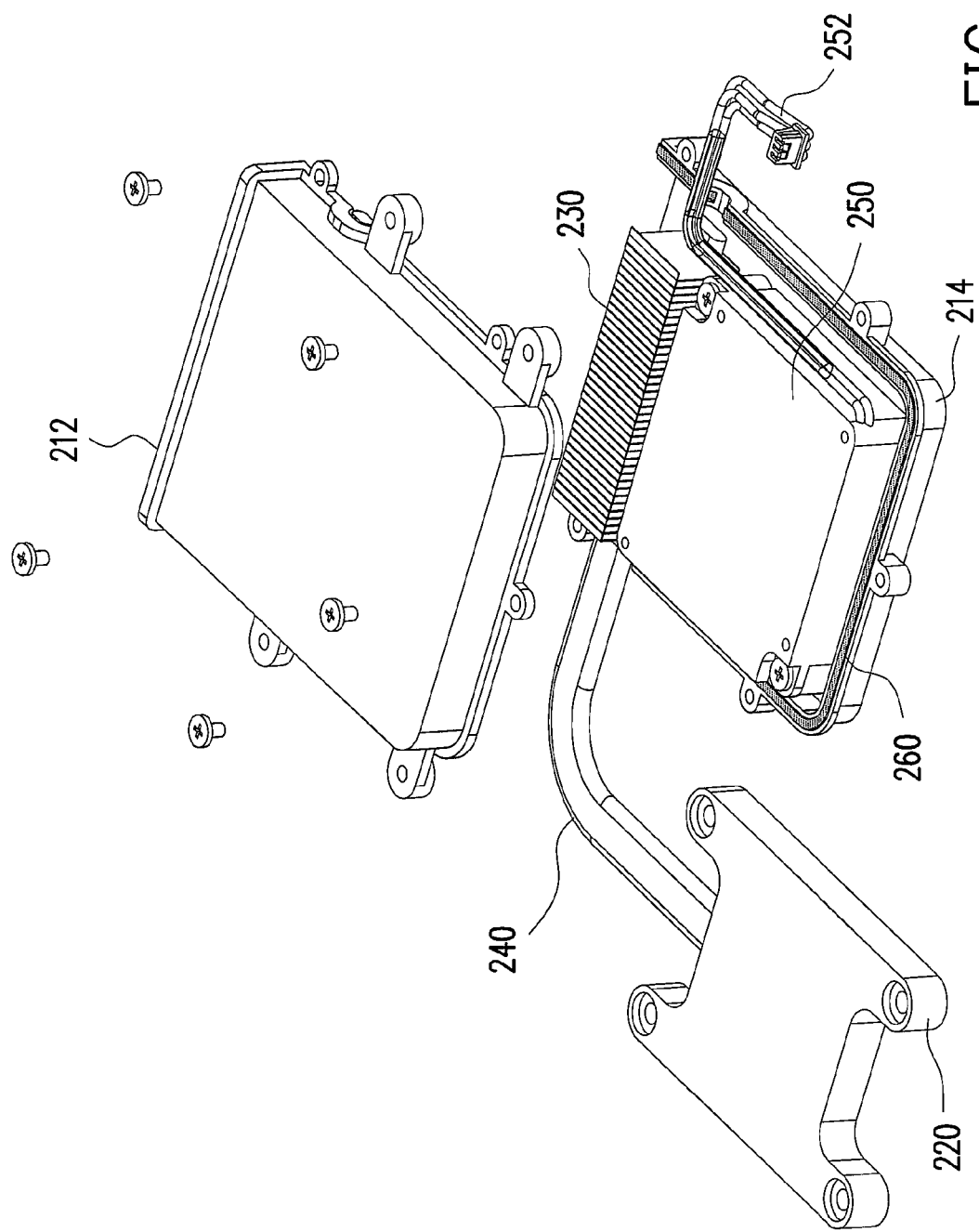

2. The radiator 230 is assembled to the second separated cover 214, and the heat pipe 240 is extended through the wall of the separated chamber 210 to the separated chamber 210 of FIG. 7 to connect the radiator 230 and the heat absorber 220 as shown in FIG. 9B.

Figure 9C:
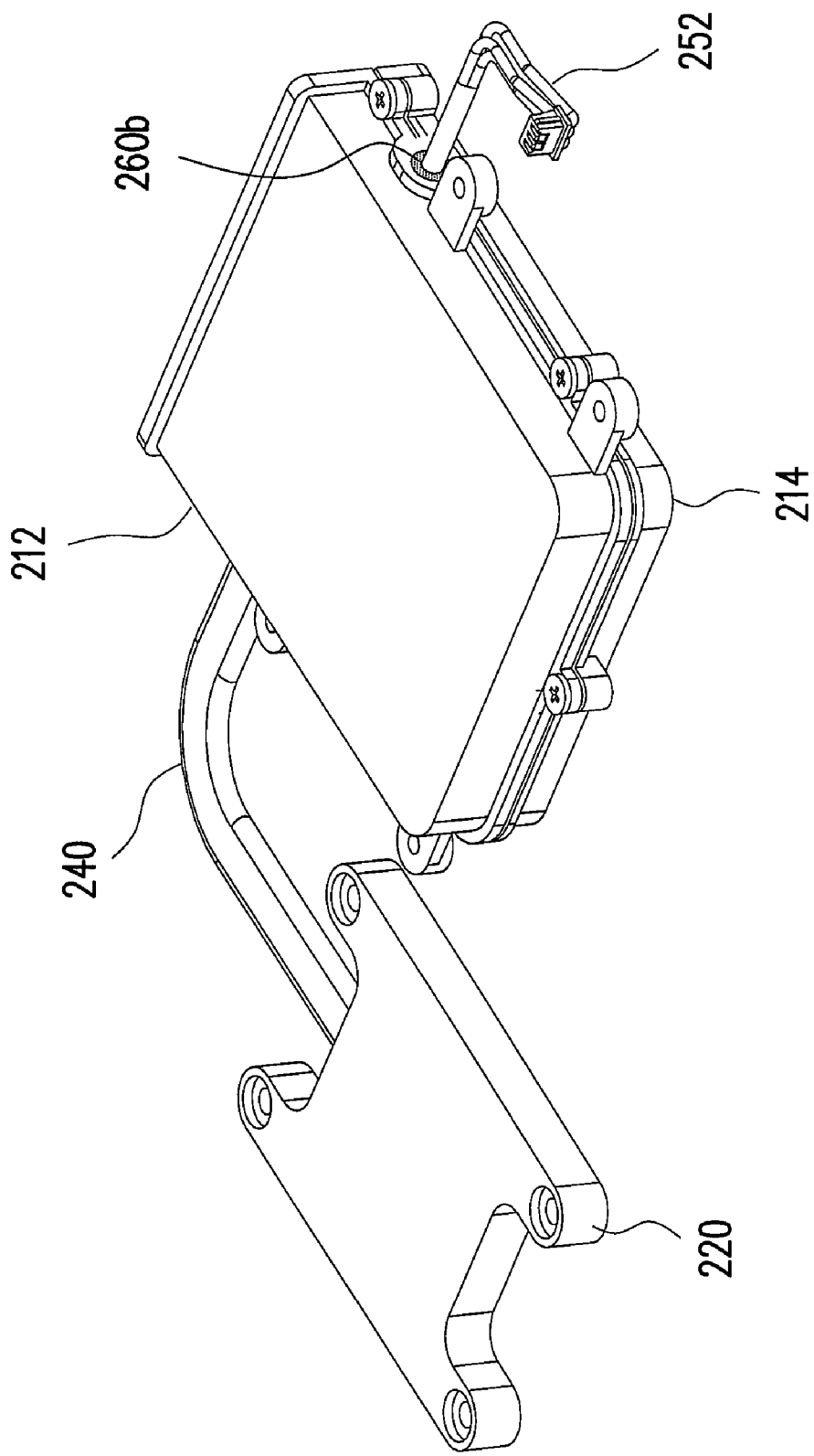
Figure 9D:
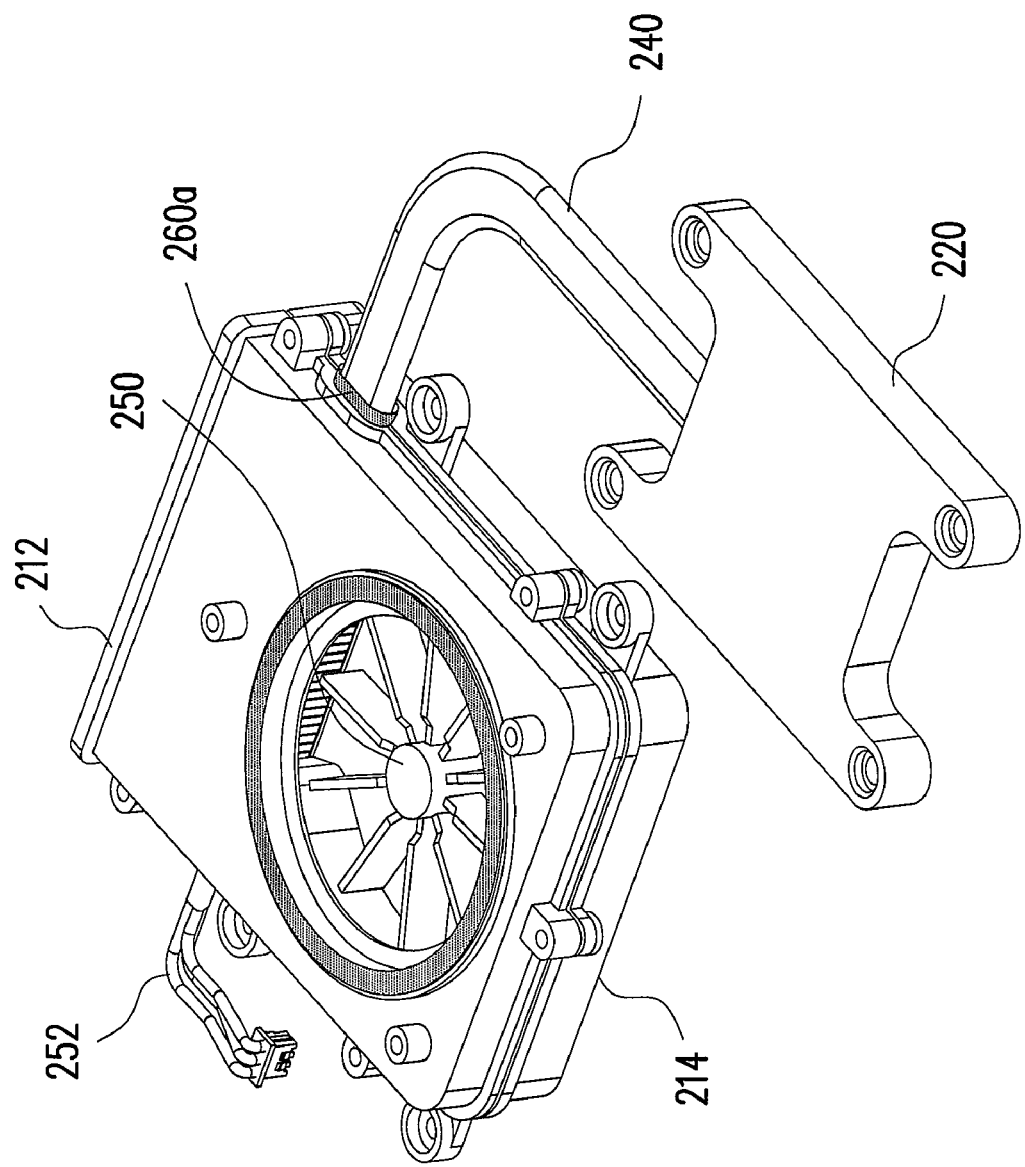

3. The first separated cover 212 and the second separated cover 214 are fixed with screws to form a module, the waterproof adhesive 260b is disposed between a segment of the power core 252 and the wall of the separated chamber 210 (FIG. 7) where the power core passes through, wherein the power core extends through the space between the first separated cover 212 and the second separated cover 214 as shown in FIG. 9C. Moreover, the waterproof adhesive 260a is disposed between a segment of the heat pipe 240 and the wall of the separated chamber 210 (FIG. 7) where the power core passes through, wherein the heat pipe 240 extends through the space between the first separated cover 212 and the second separated cover 214 to connect the heat absorber 220 as shown in FIG. 9D.

Figure 9E:
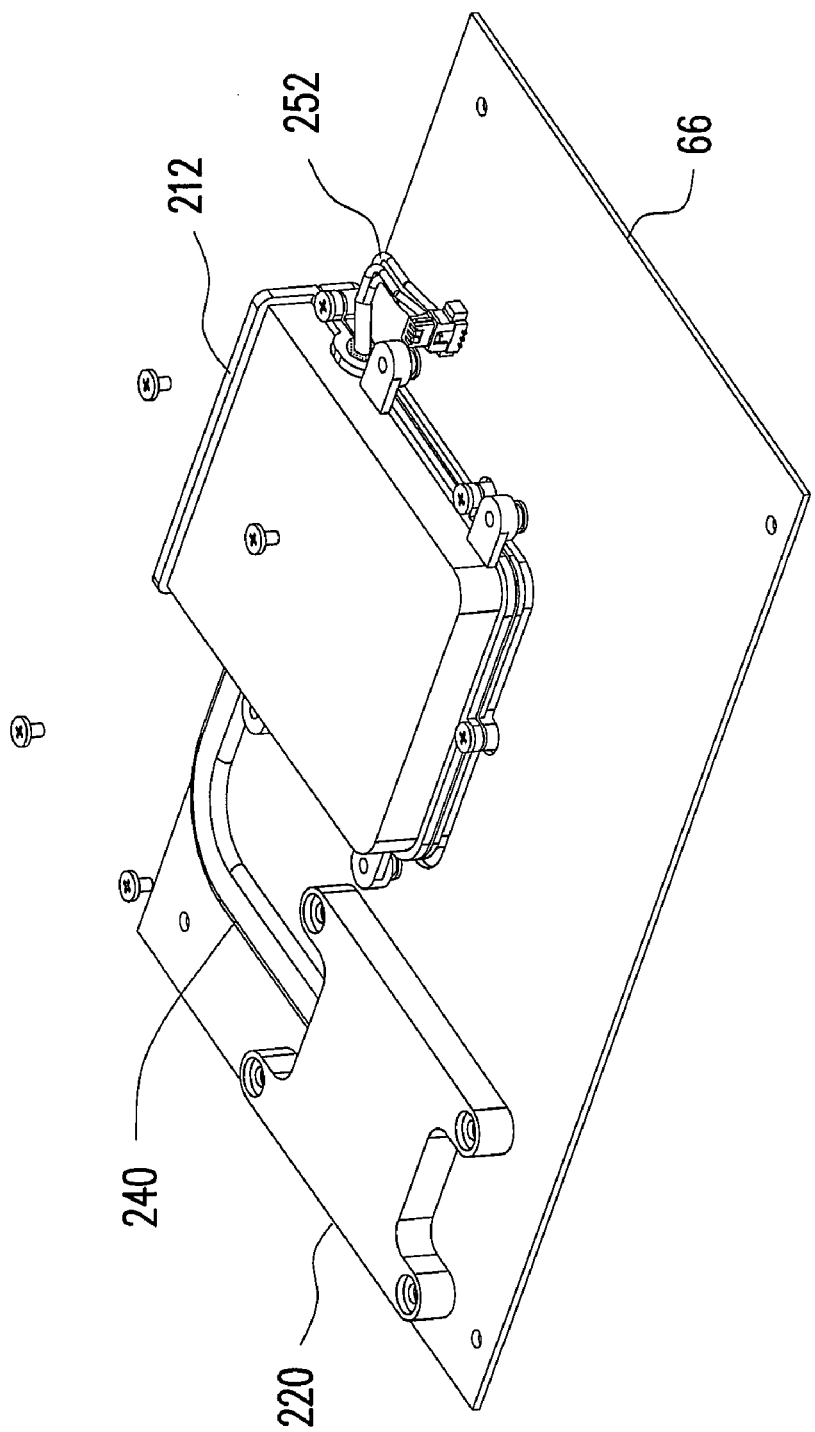

4. The module of FIG. 9C is assembled to the mainboard 66 as shown in FIG. 9E, and the heat absorber 220 is contacted to the heat source 64 as shown in FIG. 7.

Figure 9F:
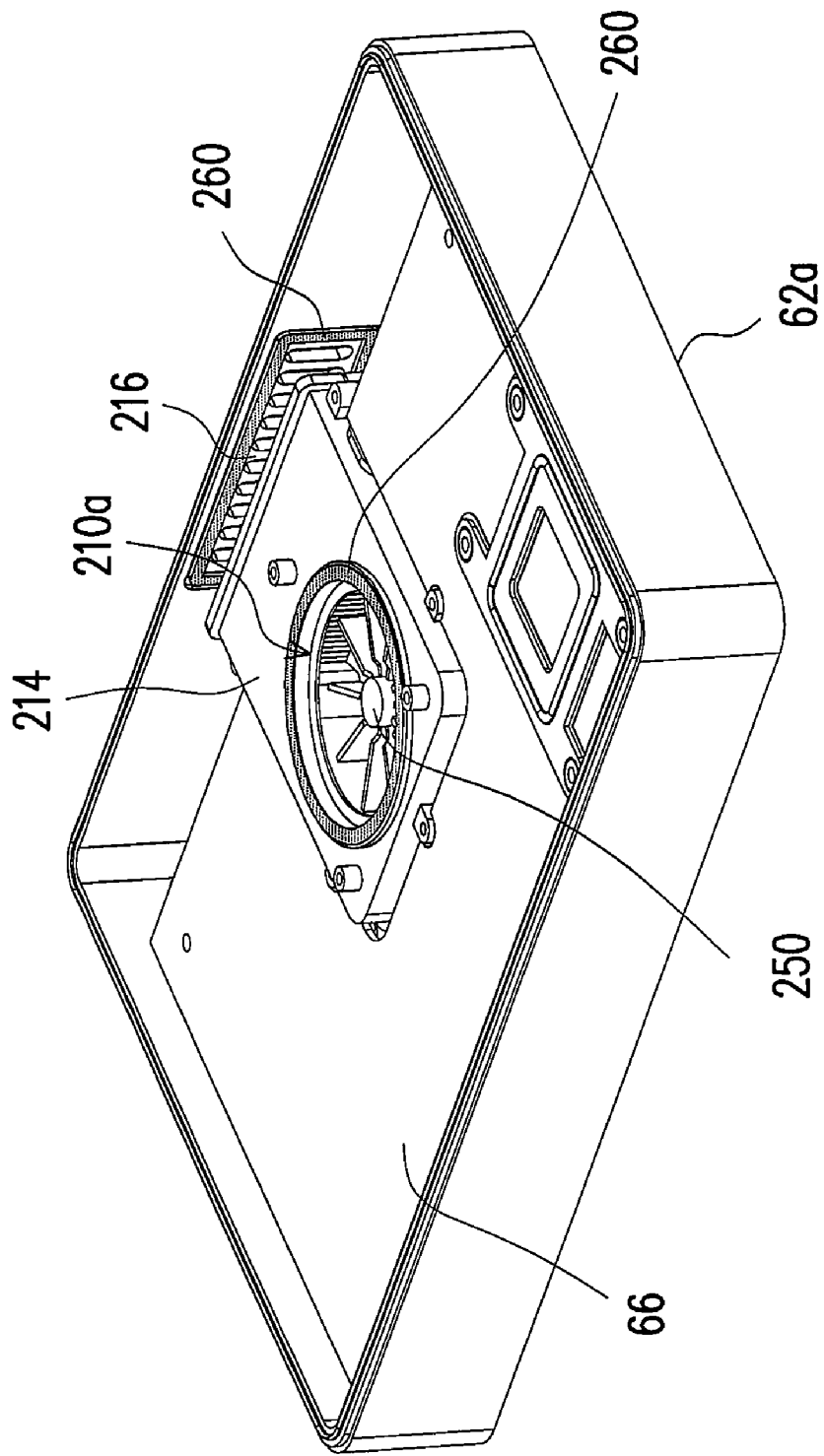

5. The turned over mainboard 66 and the aforementioned module are assembled to the inner side of the top cover 62a, wherein each of the first separated cover 212 (FIG. 9E) and the second separated cover 214 is connected to the side cover 216 as shown in FIG. 9F.

Figure 9G:
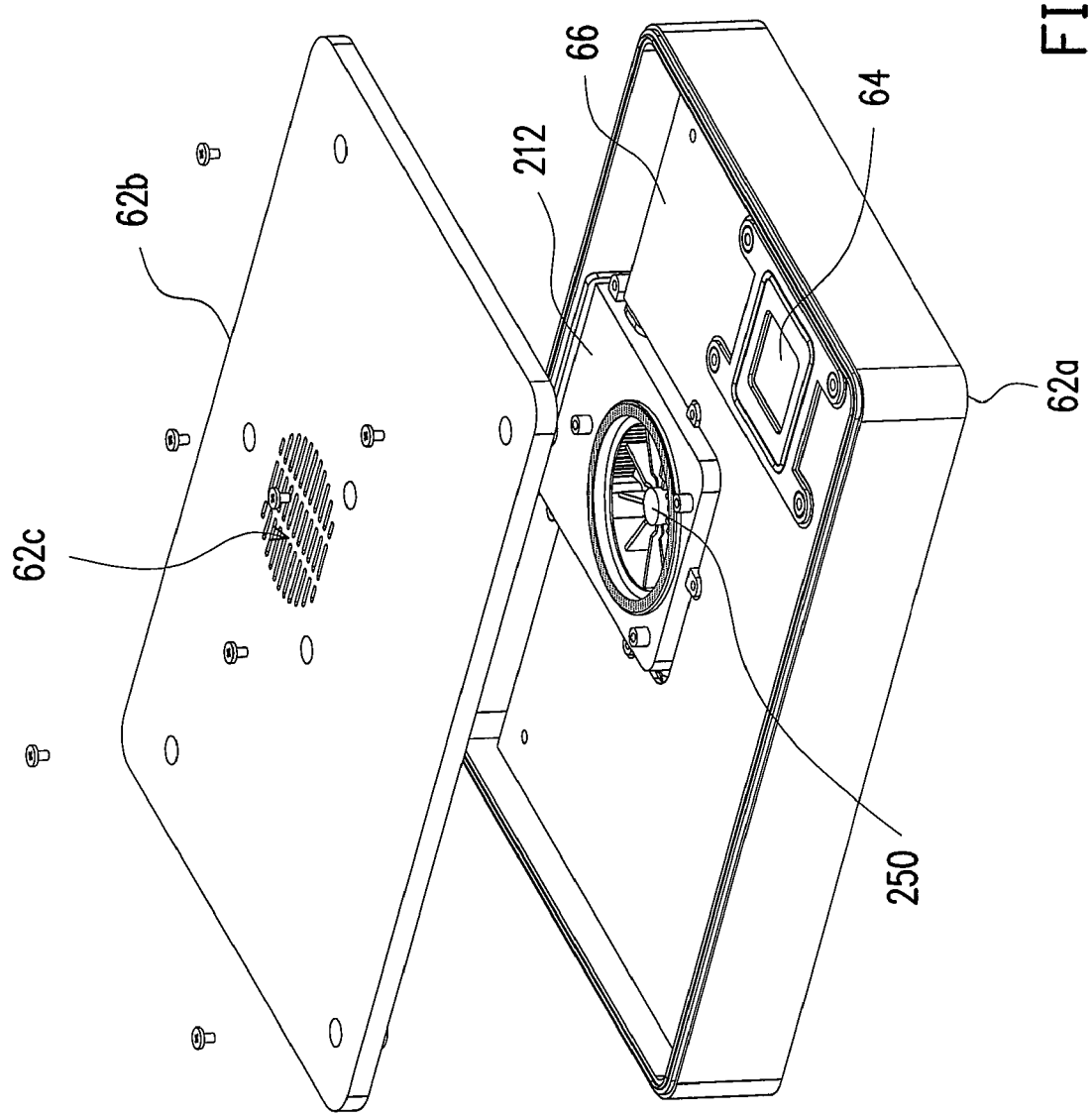

6. The top cover 62a is assembled to the base cover 62b, and the connective opening 62c is connected to the first air channel 210a as shown in FIGS. 9F and 9G.

The heat absorber mentioned in the second embodiment may be a cooling pad or a thermal pad, and the radiator may be a heat sink.

The Third Embodiment

Figure 10:
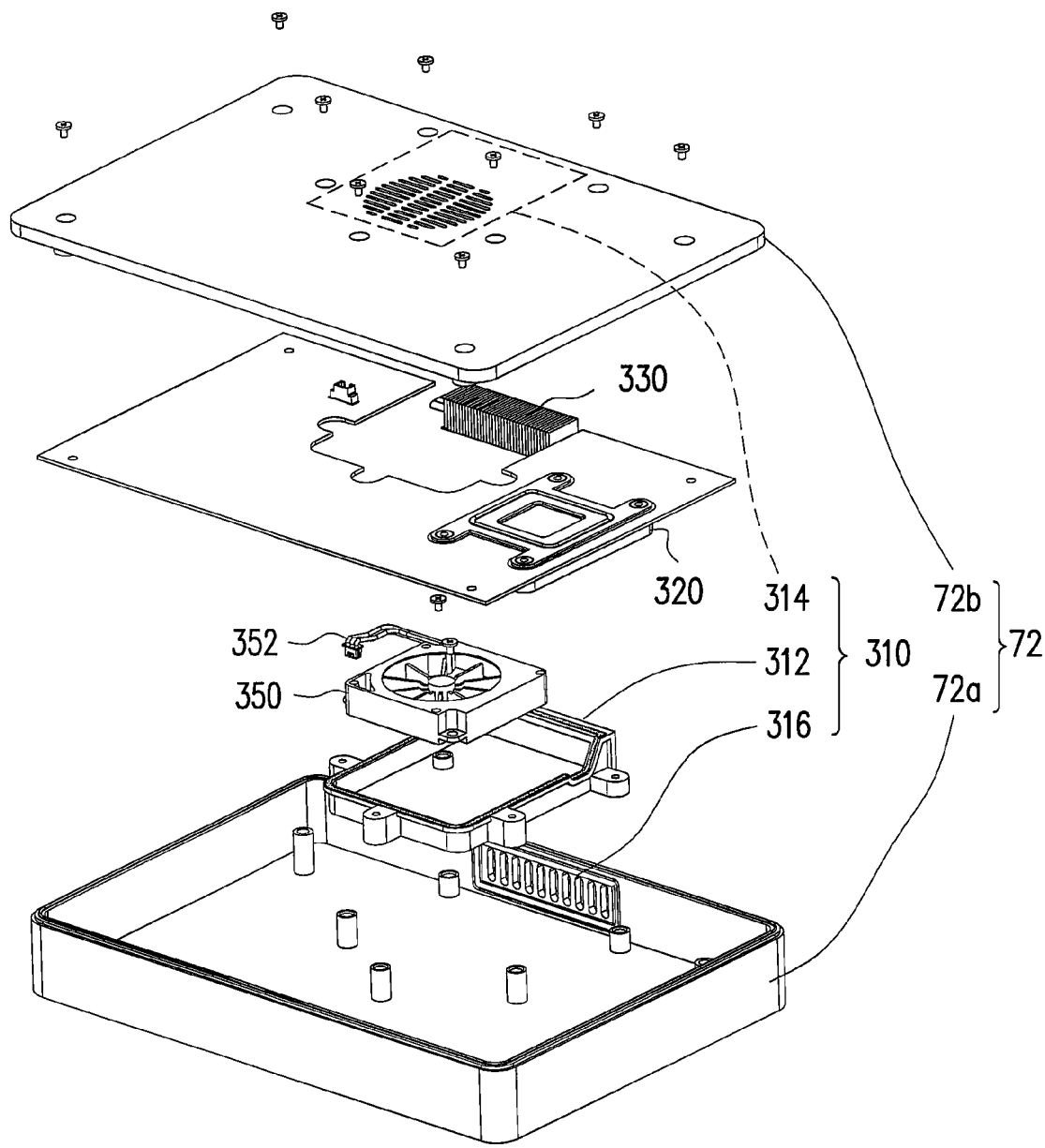
FIG. 10 is an exploded view of a portable electronic device according to a third embodiment of the present invention.
Figure 11:
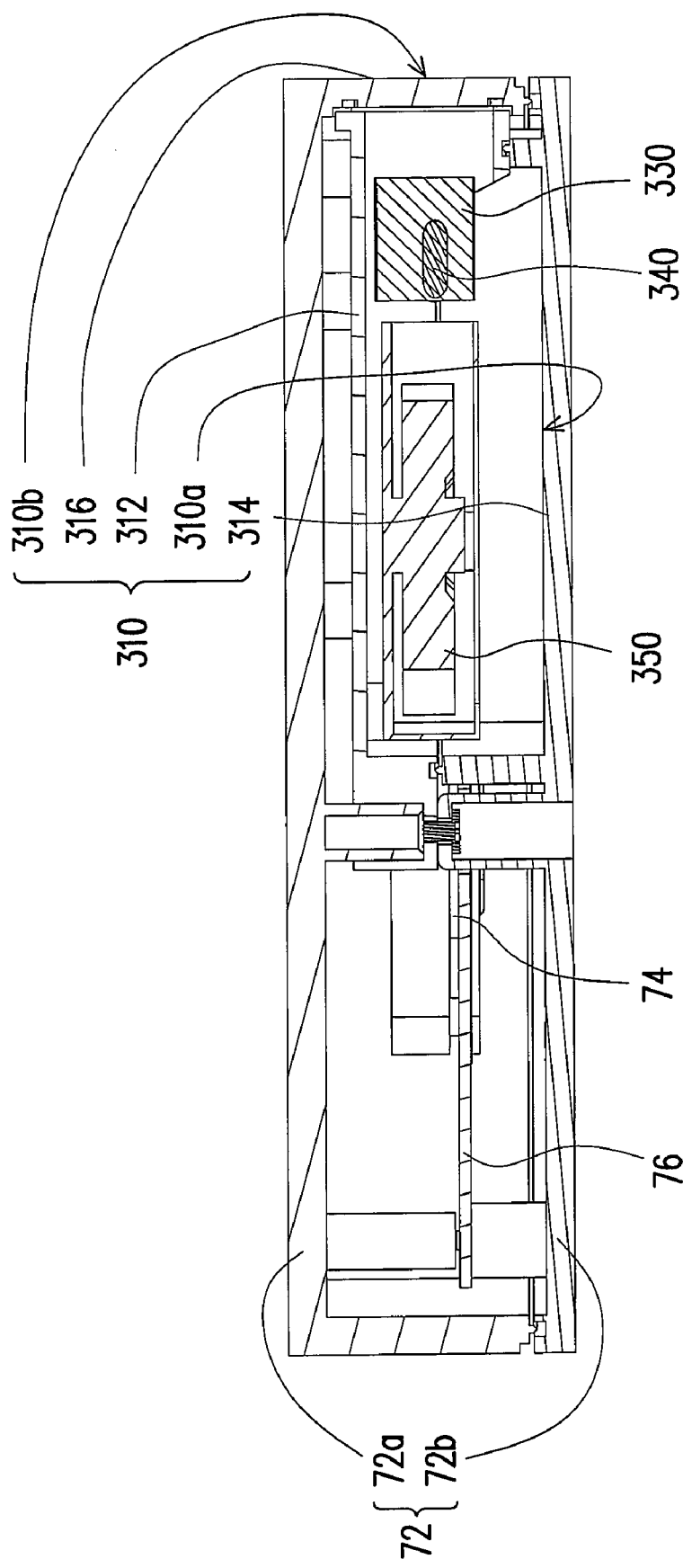
FIG. 11 is a sectional view of the portable electronic device shown in FIG. 10.

FIG. 10 is an exploded view of a portable electronic device according to a third embodiment of the present invention; FIG. 11 is a sectional view of the portable electronic device of FIG. 10. Referring FIGS. 10 and 11, the portable electronic device 70 of the third embodiment comprises a housing 72, a heat source 74, a mainboard 76 and a waterproof thermal management module. The housing 72 comprises a top cover 72a and a base cover 72b. The waterproof thermal management module comprises a separated chamber 310 (FIG. 11), a heat absorber 320, a radiator 330, a heat pipe 340 (FIG. 11), and a fan 350. The fan 350 comprises a power core 352.

Figure 12A:
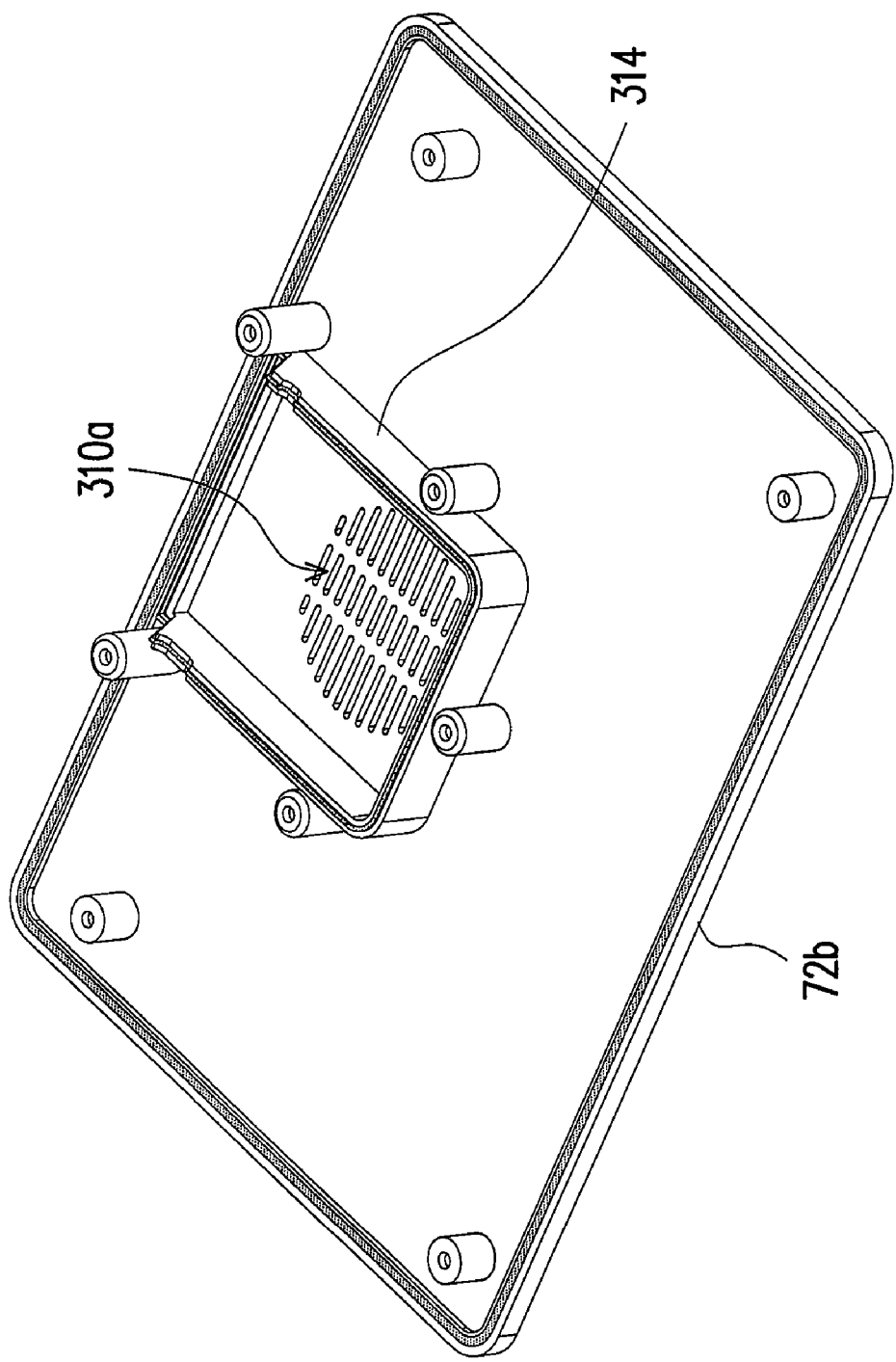
FIG. 12A is a perspective view of the top cover of FIG. 10 with a certain angle of rotation.

FIG. 12A is a perspective view of the top cover of FIG. 10 with a certain angle of rotation. Referring FIGS. 11 and 12A, the separated chamber 310 has an enclosed space, configured to contain the radiator 330 and the fan 350, and isolate the radiator 330 and the fan 350 from other parts in the housing 72. The separated chamber 310 comprises a first separated cover 312, a second separated cover 314 and a side cover 316. The second separated cover 314 is integrally formed with the base cover 72b and forms a first air channel 310a. The side cover 316 is integrally formed with the top cover 72a and forms a second air channel 310b. Each of the first air channel 310a and the second air channel 310b communicating with the outside of the housing 72. The fan 350 provides cooling air to cool down the radiator 330 through the first air channel 310a, and expels hot air through the second air channel 310b.

Figure 12B:
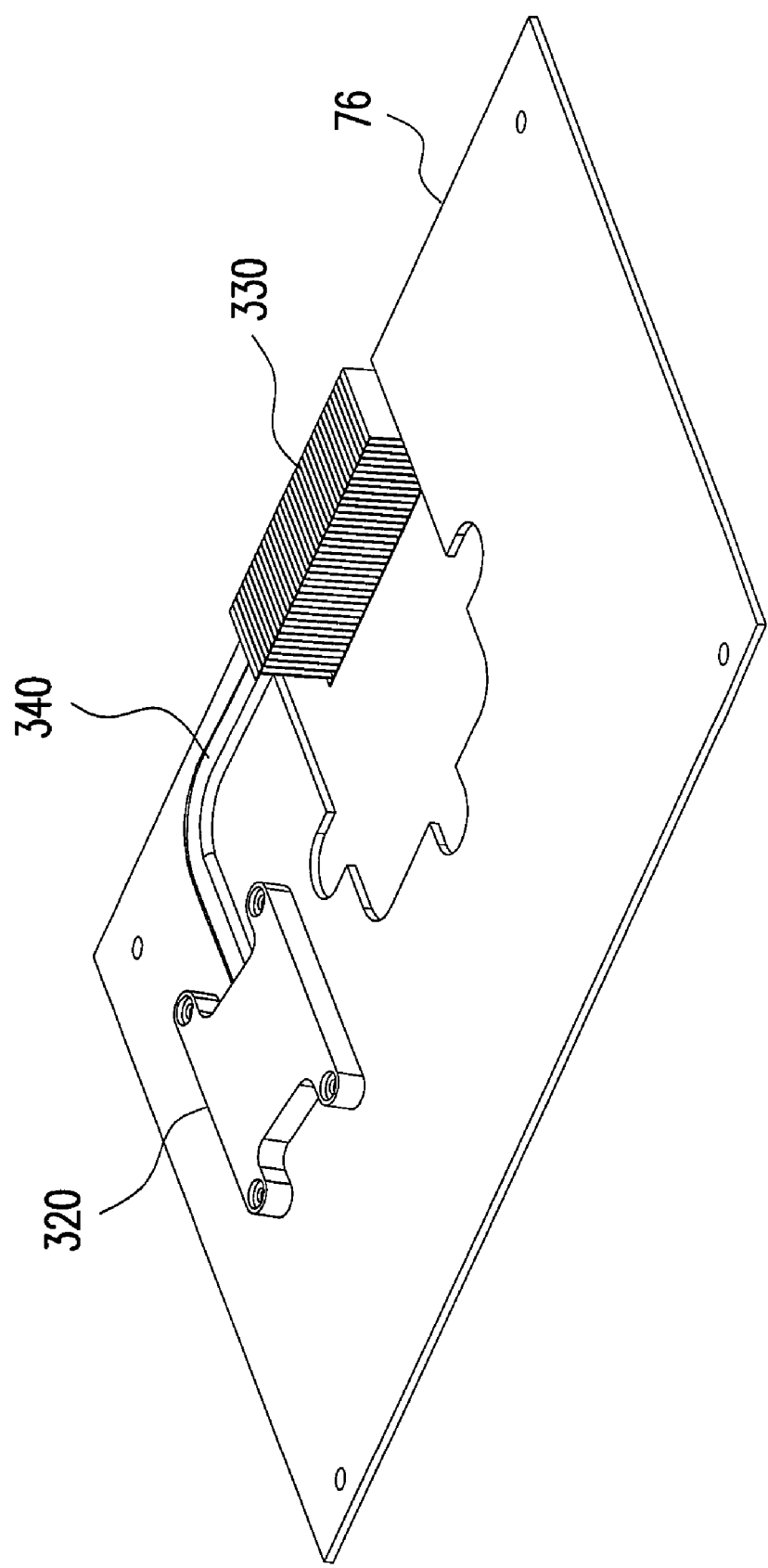
FIG. 12B is a perspective view of a mainboard carrying the heat absorber, the radiator and the heat pipe of FIG. 10.

FIG. 12B is a perspective view of a mainboard carrying the heat absorber, the radiator and the heat pipe of FIG. 10. Referring FIG. 12B, the heat absorber 320, the radiator 330 and the heat pipe 340 are assembled to the mainboard 76 in a modular approach. The heat pipe 340 is connected to the heat absorber 320 and the radiator 330. The heat absorber 320 is assembled to the mainboard 76 for contacting the heat source 74 (FIG. 11), and heat of the heat absorber 320 may be transferred to the radiator 330 through the heat pipe 340.

Figure 13A:
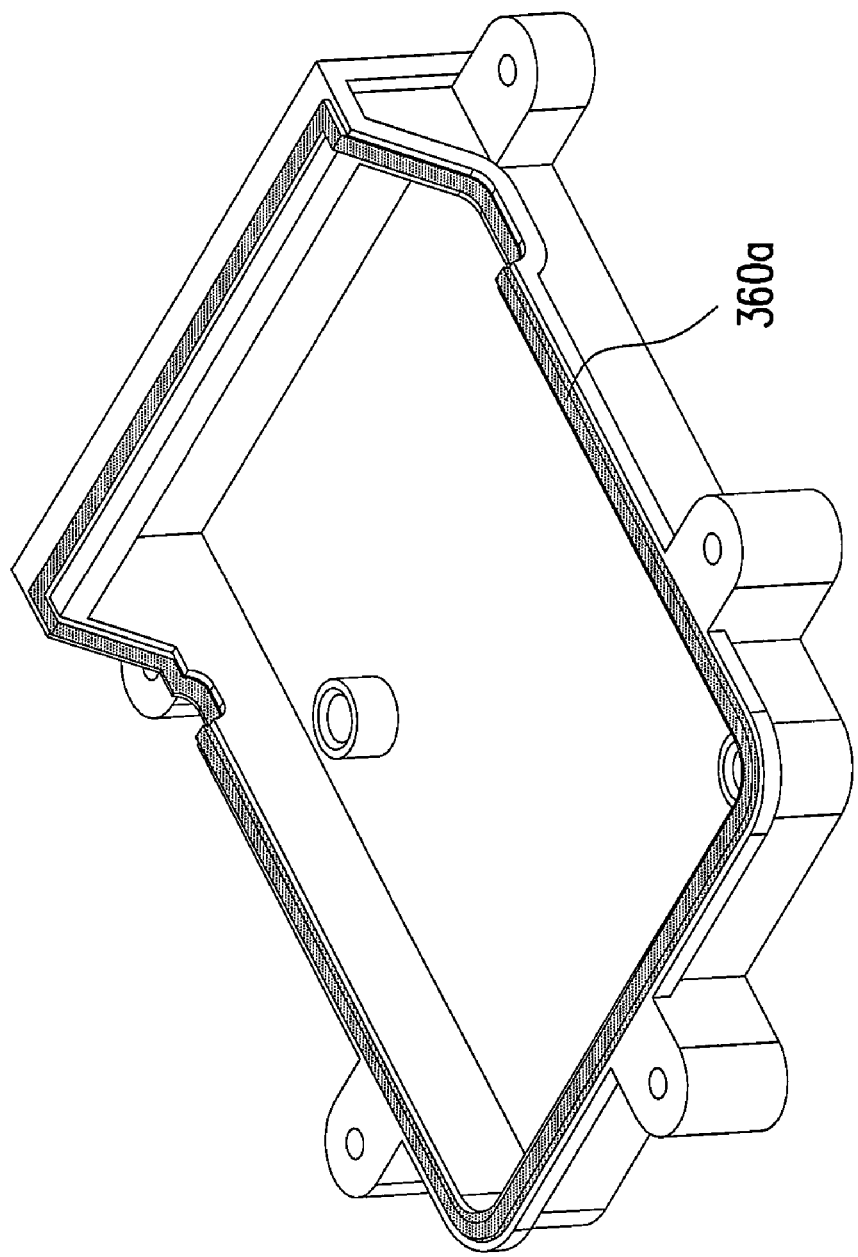
FIG. 13A illustrates a distribution of waterproof adhesive of the first separated cover of FIG. 10.
Figure 13B:
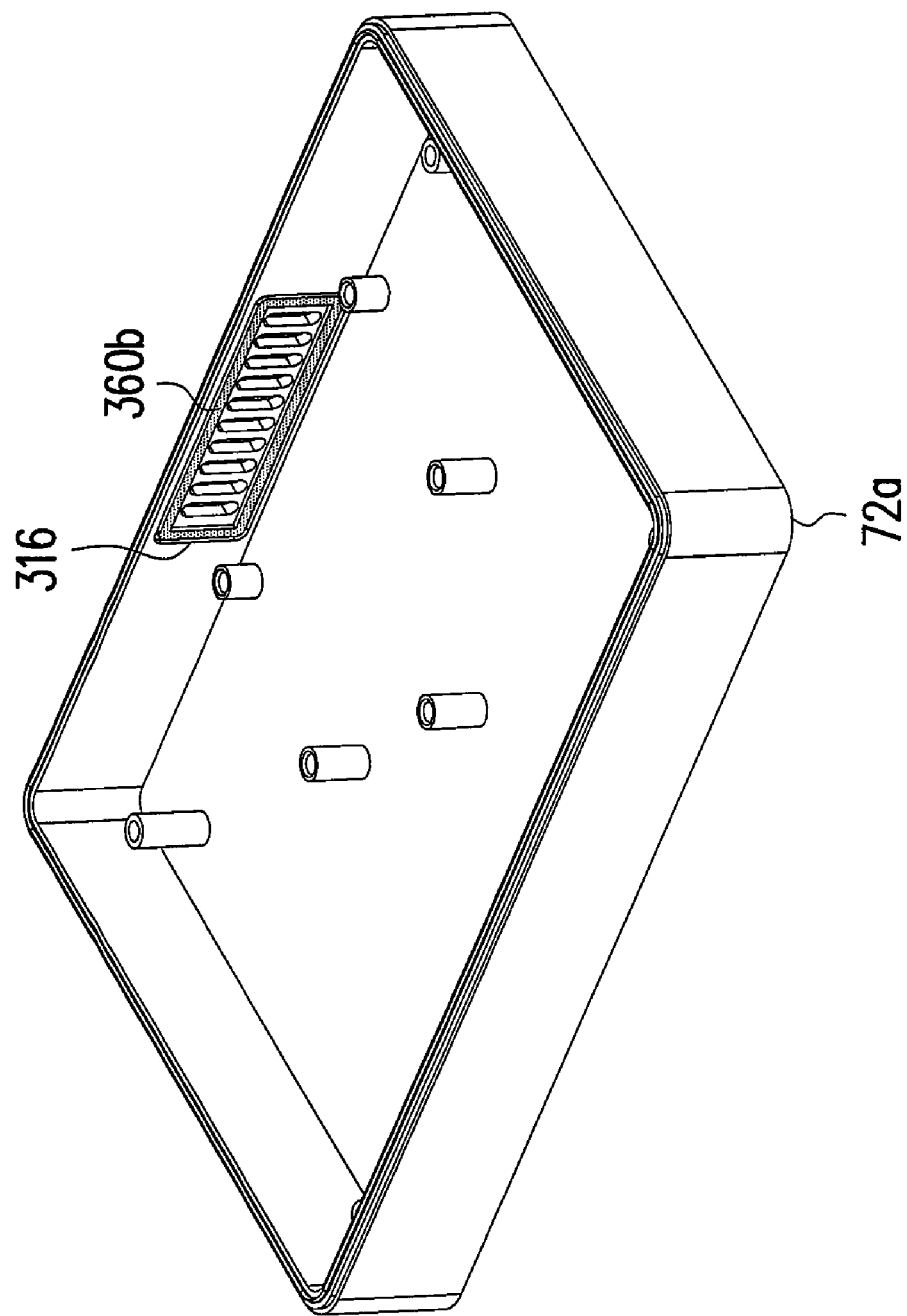
FIG. 13B illustrates a distribution of waterproof adhesive of the side cover of FIG. 10.

FIG. 13A illustrates a distribution of waterproof adhesive of the first separated cover; and FIG. 13B illustrates a distribution of waterproof adhesive of the side cover of FIG. 10. Referring FIGS. 12A, 13A and 13B, the waterproof adhesive 360a (FIG. 13A) is disposed at the joint between the first separated cover 312 and the second separated cover 314 (FIG. 12A), and the waterproof adhesive 360b (FIG. 13B) is disposed at the joint between the second separated cover 314 (FIG. 12A) and the side cover 316 (FIG. 13B).

In the third embodiment, waterproof adhesive 360a is disposed between a segment of the heat pipe 340 of FIG. 11 and the wall of the separated chamber 310 where the heat pipe 340 passes through, wherein the heat pipe 340 (FIG. 11) extends though the space between the first separated cover 312 of FIG. 13A and the second separated cover 314 of FIG. 12A. Moreover, the waterproof adhesive 360a is disposed between a segment of the power core 352 of FIG. 10 and the wall of the separated chamber 310 (FIG. 11) where the power core 352 passes through, wherein the power core 352 extends though the space between the first separated cover 312 and the second separated cover 314. Thus, the water and moisture are prevented from entering inside the enclosed space by disposing waterproof adhesive at the joint between the aforementioned elements.

FIGS. 14A-14D illustrate an assembling process of some of the parts of the portable electronic device shown in FIG. 10. Referring FIGS. 14A-14D, components of the portable electronic device 70 (FIG. 10) may be assembled according to the following steps.

Figure 14A:
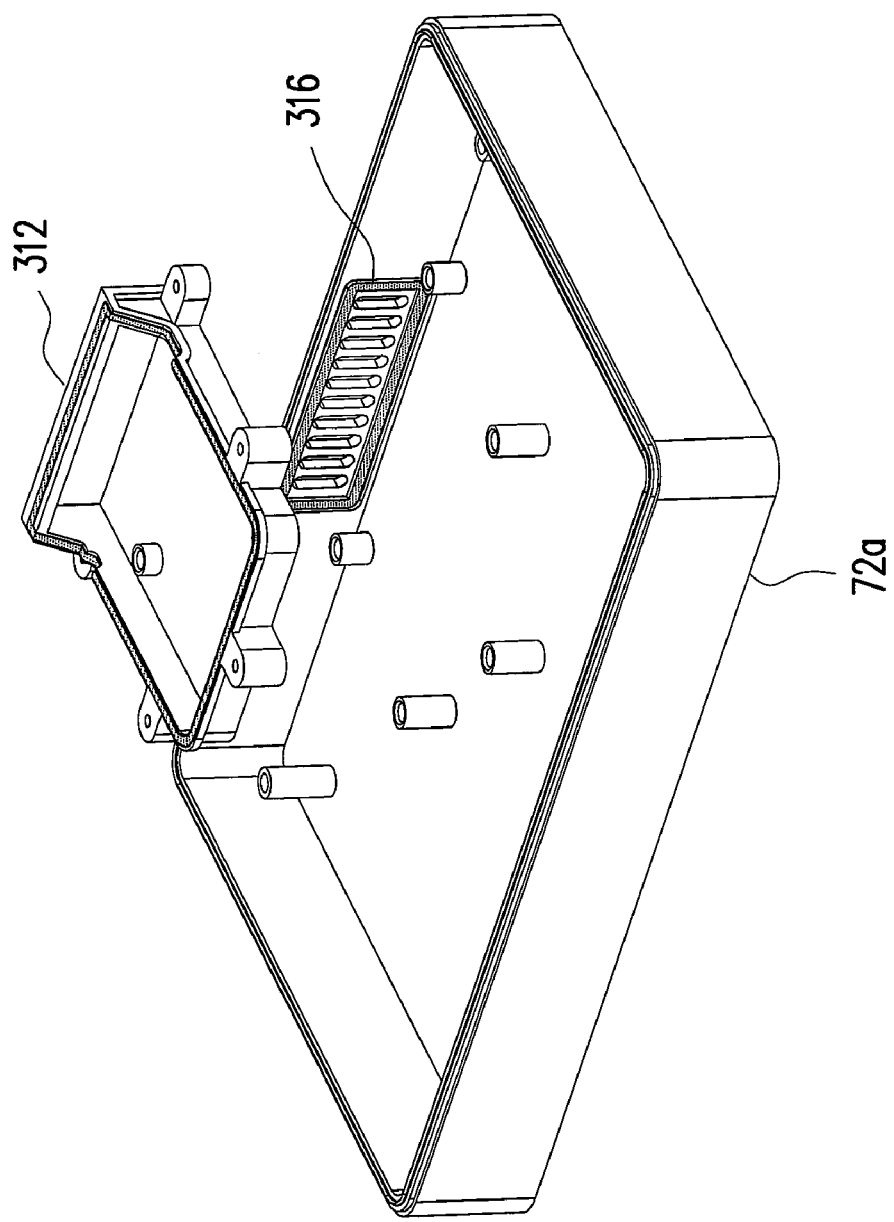
FIGS. 14A-14D illustrate an assembling process of some of the parts of the portable electronic device shown in FIG. 10.

1. The first separated cover 312 is assembled to the inner side of the top cover 72 as shown in FIG. 14A.

Figure 14B:
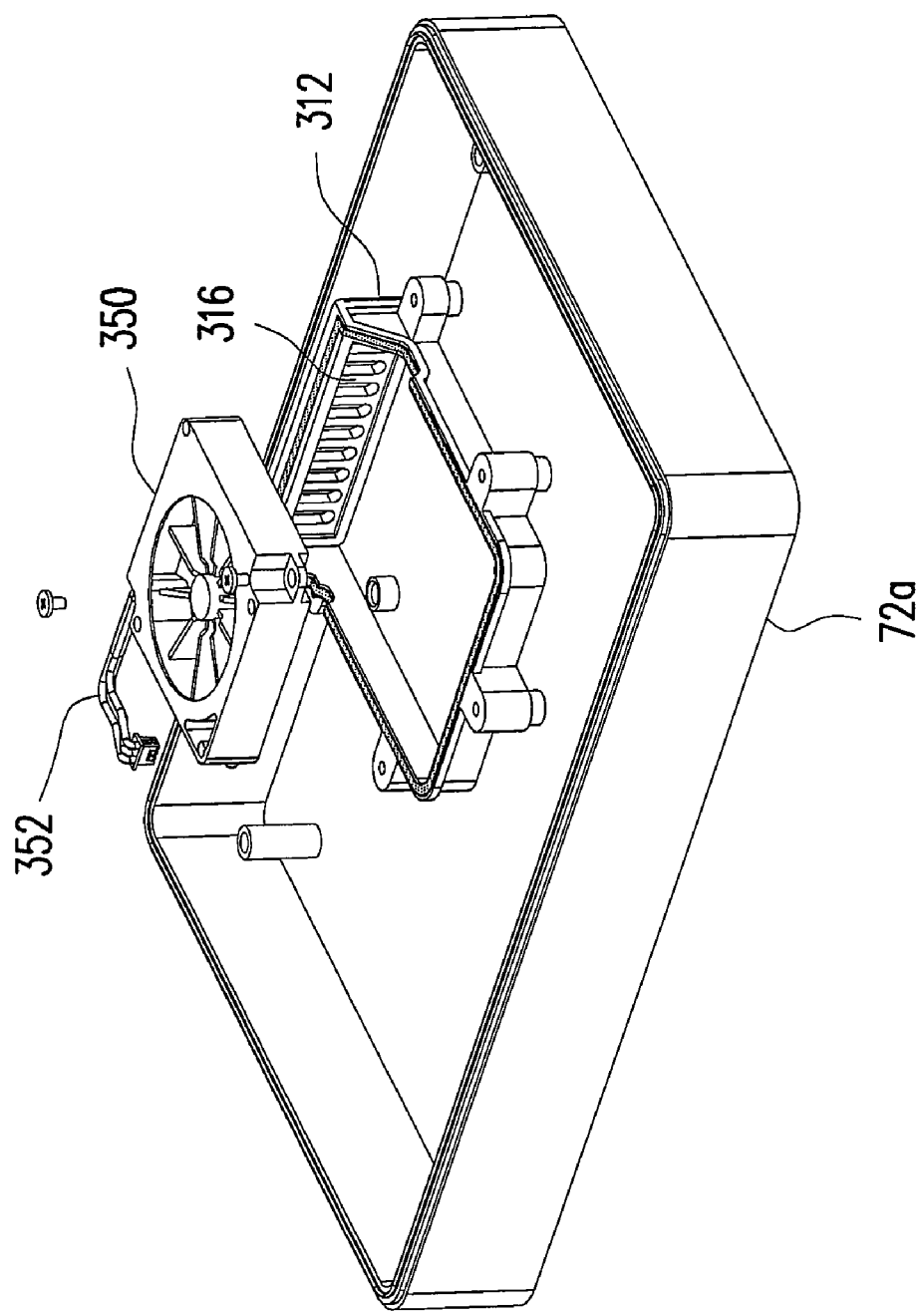

2. The fan 350 is fixed on the first separated cover 312 with screws, and the power core 352 is extended from the housing 72 through the wall of the separated chamber 310 (FIG. 11) to the first separated cover 312 to connect the fan 350 as shown in FIG. 14B.

Figure 14C:
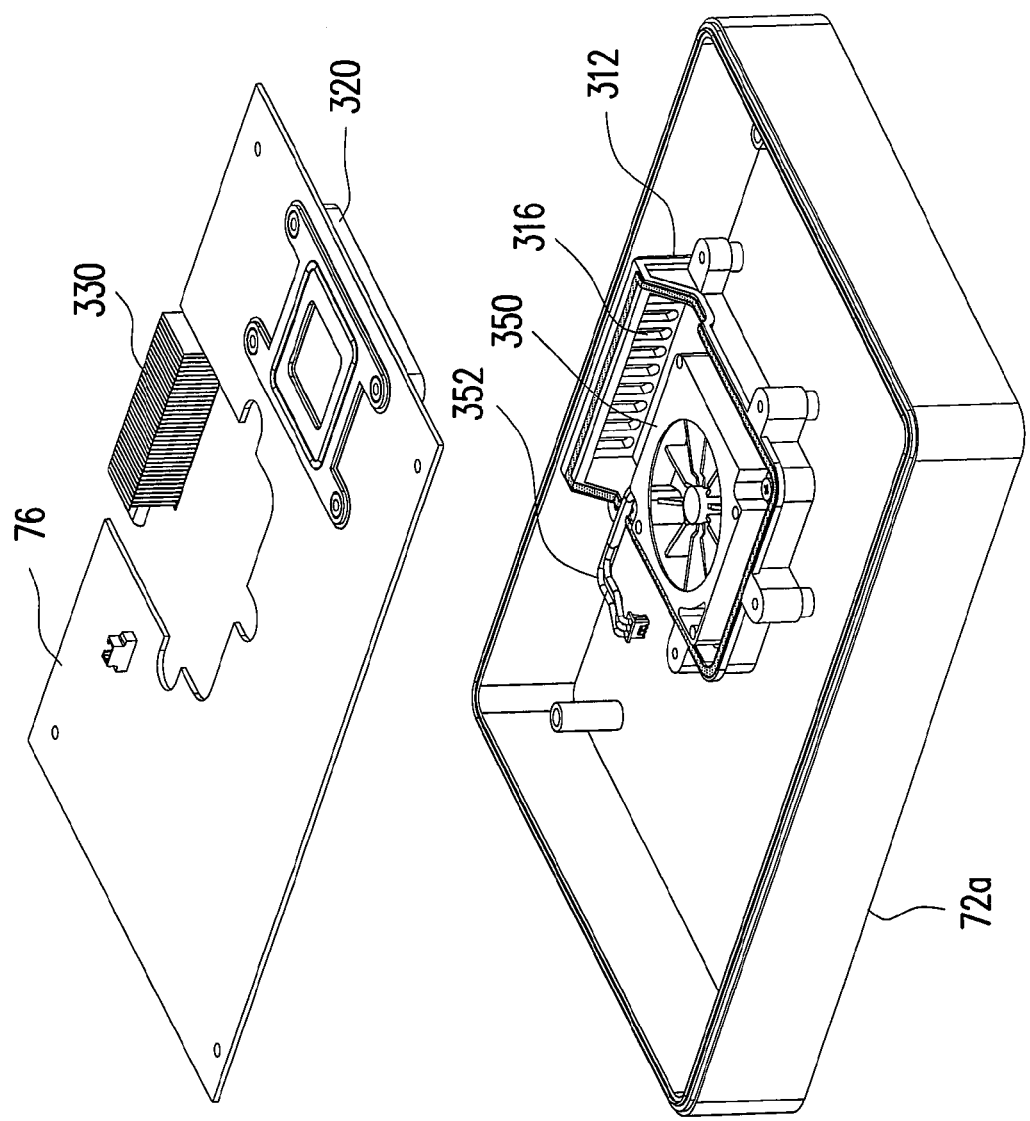

3. The mainboard 76 is assembled to the inner side of the top cover 72a, wherein the mainboard 76 comprises the heat absorber 320, the radiator 330 and the heat pipe 340. The heat pipe 340 (FIG. 11) is extended through the wall of the separated chamber 310 (FIG. 11) into the separated chamber 310 to connect the heat absorber 320 as shown in FIG. 14C.

Figure 14D:
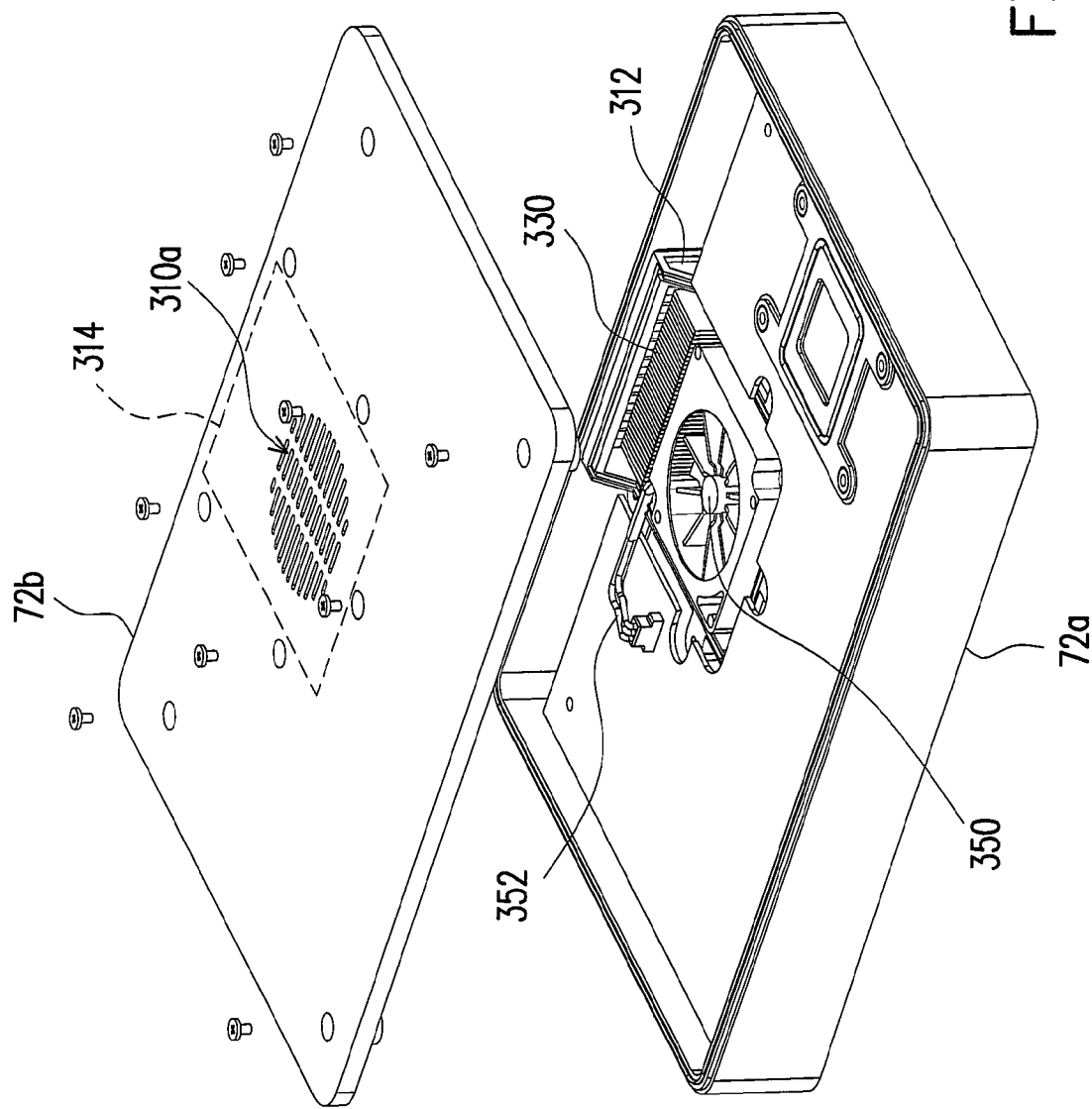

4. The base cover 72b is assembled to the top cover 72a, and the second separated cover 314 is connected to the first separated cover 312 (FIG. 13A) and the side cover 316 (FIG. 14C) as shown in FIG. 14D.

The heat absorber mentioned in the third embodiment may be a cooling pad or a thermal pad, and the radiator may be a heat sink.

In summary, the present invention has at least the following advantages.

1. A radiator and a fan are disposed in an enclosed separated chamber, cool air and hot air may be absorbed and expelled through two air channels respectively to achieve the cooling effect, and parts in the housing of a portable electronic device may be isolated from outside to achieve waterproof effect.

2. A remote heat exchange cooling module is used, and a heat pipe is connected to a radiator to contact a heat source, so the disposition of the radiator on a mainboard is flexible, and no special design for the mainboard is required. Thus, the remote heat exchange cooling module has a high sharing ability, and the entire thickness of a portable electronic device is decreased accordingly.

3. In the aforementioned first and third embodiments, the cooling device (such as heat absorber, radiator, heat pipe etc.) may be assembled to the mainboard in a modular approach in advance, and therefore assembly efficiency may be improved accordingly.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A waterproof thermal management module, for a portable electronic device including a housing and a heat source, comprising:

a separated chamber, disposed in the housing having a first air channel and a second air channel communicating with outside of the housing, wherein the separated chamber comprises a first separated cover, a second separated cover and a side cover, the first separated cover is integrally formed with the housing, the second separated cover is assembled to the first separated cover to form the first air channel, the side cover is integrally formed with the housing and forms the second air channel, the first separated cover comprises an assembly opening and a sealing cover for sealing the assembly opening, and waterproof adhesive is disposed at the joint between the assembly opening and the sealing cover;

a heat absorber, disposed in the housing for contacting the heat source;

a radiator, disposed in the separated chamber;

a heat pipe, extending from inside the housing through the wall of the separated chamber into the separated chamber and connecting the heat absorber and the radiator, wherein waterproof adhesive is disposed between a segment of the heat pipe and the wall of the separated chamber where the heat pipe passes through, and the heat pipe extends through space between the assembly opening and the sealing cover; and a fan, disposed in the separated chamber.

2. The waterproof thermal management module as claimed in claim 1 further comprising a power core extending from the housing through the wall of the separated chamber into the separated chamber and connecting the fan, wherein waterproof adhesive is disposed between a segment of the power core and the wall of the separated chamber where the heat pipe passes through, and the power core extends through space between the assembly opening and the sealing cover.

3. A waterproof thermal management module, for a portable electronic device including a housing, comprising a top cover and a base cover assembled to the top cover, and a heat source, comprising:

a separated chamber, disposed in the housing having a first air channel and a second air channel communicating with outside of the housing, wherein the separated chamber comprises a first separated cover, a second separated cover and a side cover, the first separated cover is assembled to an inner side of the top cover, the second separated cover is assembled to the first separated cover to form the first air channel, the base cover has a connective opening for connecting to the first air channel, the side cover is integrally formed with the top cover and forms the second air channel, each of the first separated cover and the second separated cover is connected with the side cover, and waterproof adhesive is disposed at the joint between the first separated cover and the second separated cover, at the joint between the first separated cover and the side cover, at the joint between the second separated cover and the side cover, and at the joint between a portion of the second separated cover surrounding the first air channel and a portion of the base cover surrounding the connective opening;

a heat absorber, disposed in the housing for contacting the heat source;

a radiator, disposed in the separated chamber;

a heat pipe, extending from inside the housing through the wall of the separated chamber into the separated chamber and connecting the heat absorber and the radiator, wherein waterproof adhesive is disposed between a segment of the heat pipe and the wall of the separated chamber where the heat pipe passes through, and the heat pipe extends through space between the first separated cover and the second separated cover; and a fan, disposed in the separated chamber.

4. The waterproof thermal management module as claimed in claim 3 further comprising a power core extending from the housing through the wall of the separated chamber into the separated chamber and connecting the fan, wherein waterproof adhesive is disposed between the a segment of power core and the wall of the separated chamber where the heat pipe passes through, and the power core extends through space between the first separated cover and the second separated cover.

5. A waterproof thermal management module, for a portable electronic device including a housing, comprising a top cover and a base cover assembled to the top cover, and a heat source, comprising:

a separated chamber, disposed in the housing having a first air channel and a second air channel communicating with outside of the housing, wherein the separated chamber comprises a first separated cover, a second separated cover and a side cover, the first separated cover is assembled to an inner side of the top cover, and the second separated cover is integrally formed with the base cover and forms the first air channel, the side cover is integrally formed with the top cover and forms the second air channel, the first separated cover is connected with the second separated cover, the second separated cover is connected with the side cover, and waterproof adhesive is disposed at the joint between the first separated cover and the second separated cover, and at the joint between the second separated cover and the side cover;

a heat absorber, disposed in the housing for contacting the heat source;

a radiator, disposed in the separated chamber;

a heat pipe, extending from inside the housing through the wall of the separated chamber into the separated chamber and connecting the heat absorber and the radiator, wherein waterproof adhesive is disposed between a segment of the heat pipe and the wall of the separated chamber where the heat pipe passes through, wherein the heat pipe extends through space between the first separated cover and the second separated cover; and a fan, disposed in the separated chamber.

6. The waterproof thermal management module as claimed in claim 5 further comprising a power core extending from the housing through the wall of the separated chamber into the separated chamber and connecting the fan, wherein waterproof adhesive is disposed between a segment of the power core and the wall of the separated chamber where the heat pipe passes through, and the power core extends through space between the first separated cover and the second separated cover.

7. A portable electronic device, comprising:

a housing;

a heat source, disposed in the housing;

a separated chamber, disposed in the housing having a first air channel and a second air channel communicating with outside of the housing, wherein the separated chamber comprises a first separated cover, a second separated cover and a side cover, the first separated cover is integrally formed with the housing, the second separated cover is assembled to the first separated cover to form the first air channel, the side cover is integrally formed with the housing and forms the second air channel, the first separated cover comprises an assembly opening and a sealing cover for sealing the assembly opening, and waterproof adhesive is disposed at the joint between the assembly opening and the sealing cover;

a heat absorber, disposed in the housing for contacting the heat source;

a radiator, disposed in the separated chamber;

a heat pipe, extending from inside the housing through the wall of the separated chamber into the separated chamber and connecting the heat absorber and the radiator, wherein waterproof adhesive is disposed between a segment of the heat pipe and the wall of the separated chamber where the heat pipe passes through, and the heat pipe extends through space between the assembly opening and the sealing cover; and a fan, disposed in the separated chamber.

8. The portable electronic device as claimed in claim 7 further comprising a power core extending from the housing through the wall of the separated chamber into the separated chamber and connecting the fan, wherein waterproof adhesive is disposed between a segment of the power core and the wall of the separated chamber where the heat pipe passes through, and the power core extends through space between the assembly opening and the sealing cover.

9. A portable electronic device, comprising:

a housing, comprising a top cover and a base cover assembled to the top cover;

a heat source, disposed in the housing;

a separated chamber, disposed in the housing having a first air channel and a second air channel communicating with outside of the housing, wherein the separated chamber comprises a first separated cover, a second separated cover and a side cover, the first separated cover is assembled to inner side of the top cover, and the second separated cover is assembled to the first separated cover to form the first air channel, the base cover has a connective opening for connecting the first air channel, and the side cover is integrally formed with the top cover and forms the second air channel, each of the first separated cover and the second separated cover is connected with the side cover, and waterproof adhesive is disposed at the joint between the first separated cover and the second separated cover, at the joint between the first separated cover and the side cover, at the joint between the second separated cover and the side cover, and at the joint between a portion of the second separated cover surrounding the first air channel and a portion of the base cover surrounding the connective opening;

a heat absorber, disposed in the housing for contacting the heat source;

a radiator, disposed in the separated chamber;

a heat pipe extending from inside the housing through the wall of the separated chamber into the separated chamber and connecting the heat absorber and the radiator, wherein waterproof adhesive is disposed between a segment of the heat pipe and the wall of the separated chamber where the heat pipe passes through, and the heat pipe extends through space between the first separated cover and the second separated cover; and a fan, disposed in the separated chamber.

10. The portable electronic device as claimed in claim 9 further comprising a power core extending from the housing through the wall of the separated chamber into the separated chamber and connecting the fan, wherein waterproof adhesive is disposed between a segment of the power core and the wall of the separated chamber where the heat pipe passes through, and the power core extends through space between the first separated cover and the second separated cover.

11. A portable electronic device, comprising:

a housing, comprising a top cover and a base cover assembled to the top cover;

a heat source, disposed in the housing;

a separated chamber, disposed in the housing having a first air channel and a second air channel communicating with outside of the housing, wherein the separated chamber comprises a first separated cover, a second separated cover and a side cover, the first separated cover is assembled to inner side of the top cover, and the second separated cover is integrally formed with the base cover and forms the first air channel, the side cover is integrally formed with the top cover and forms the second air channel, the first separated cover is connected to the second separated cover, and the second separated cover is connected to the side cover, and waterproof adhesive is disposed at the joint between the first separated cover and the second separated cover, and at the joint between the second separated cover and the side cover;

a heat absorber, disposed in the housing for contacting the heat source;

a radiator, disposed in the separated chamber;

a heat pipe, extending from inside the housing through the wall of the separated chamber into the separated chamber and connecting the heat absorber and the radiator, wherein waterproof adhesive is disposed between a segment of the heat pipe and the wall of the separated chamber where the heat pipe passes through, and the heat pipe extends through space between the first separated cover and the second separated cover; and a fan, disposed in the separated chamber.

12. The portable electronic device as claimed in claim 11 further comprising a power core extending from the housing through the wall of the separated chamber into the separated chamber and connecting the fan, wherein waterproof adhesive is disposed between a segment of the power core and the wall of the separated chamber where the heat pipe passes through, and the power core extends through space between the first separated cover and the second separated cover.

* * * * *